United States Patent
Herchen et al.

(10) Patent No.: US 7,517,469 B2
(45) Date of Patent: Apr. 14, 2009

(54) METHOD AND SYSTEM TO MEASURE FLOW VELOCITY AND VOLUME

(75) Inventors: Harald Herchen, Los Altos, CA (US); Erica Porras, Los Gatos, CA (US); Tetsuya Ishikawa, Saratoga, CA (US)

(73) Assignee: Sokudo Co., Ltd., Kyoto (JP)

( * ) Notice: Subject to any disclaimer, the term of this patent is extended or adjusted under 35 U.S.C. 154(b) by 106 days.

(21) Appl. No.: 11/380,913

(22) Filed: Apr. 28, 2006

(65) Prior Publication Data

US 2007/0251921 A1 Nov. 1, 2007

(51) Int. Cl.
*B44C 1/22* (2006.01)
*G05D 7/00* (2006.01)

(52) U.S. Cl. ............... 216/84; 216/85; 216/92; 700/282

(58) Field of Classification Search ............ 216/84, 216/85, 92; 700/282
See application file for complete search history.

(56) References Cited

U.S. PATENT DOCUMENTS

| | | | |
|---|---|---|---|
| 6,165,270 A | 12/2000 | Konishi et al. | |
| 6,348,098 B1 | 2/2002 | McLoughlin et al. | |
| 6,428,852 B1 | 8/2002 | Pillion et al. | |
| 6,617,079 B1 | 9/2003 | Pillion et al. | |
| 6,973,375 B2 * | 12/2005 | Brodeur et al. | 700/282 |
| 7,029,238 B1 | 4/2006 | Zagars et al. | |
| 2004/0263809 A1* | 12/2004 | Nakano | 355/30 |
| 2005/0182525 A1* | 8/2005 | Laverdiere et al. | 700/282 |

FOREIGN PATENT DOCUMENTS

JP 3717996 B 9/2005

OTHER PUBLICATIONS

Yamatake Corporation, "HPQ-D Series, Optical Liquid Leak Detectors with Self-Contained Amplifier" Specifications, (No. CP-PC-2214E), 2nd edition: issued Oct. 2003, pp. 1-12.
English translation of JP 3717996,B including text and drawings by National Center for Industrial Property Information and Training (NCIPI)—found at: http://www4.ipdl.ncipi.go.jp/cgi-bin/tran_web_cgi_ejje—an on-line translation service.
International Search Report and Written Opinion of PCT Application No. PCT/US07/67550, dated Jun. 20, 2008, 11 pages total.

* cited by examiner

*Primary Examiner*—Binh X Tran
(74) *Attorney, Agent, or Firm*—Townsend and Townsend and Crew LLP

(57) ABSTRACT

Systems, devices and methods of measuring a flow of a liquid stream for a semiconductor process are provided. The liquid stream is delivered through a liquid delivery nozzle. The nozzle is adapted to deliver the liquid stream for the semiconductor process. The free stream extends from an upstream location near the nozzle to a downstream location. The stream is marked at the upstream location and measured at the downstream location to determine the flow.

14 Claims, 18 Drawing Sheets

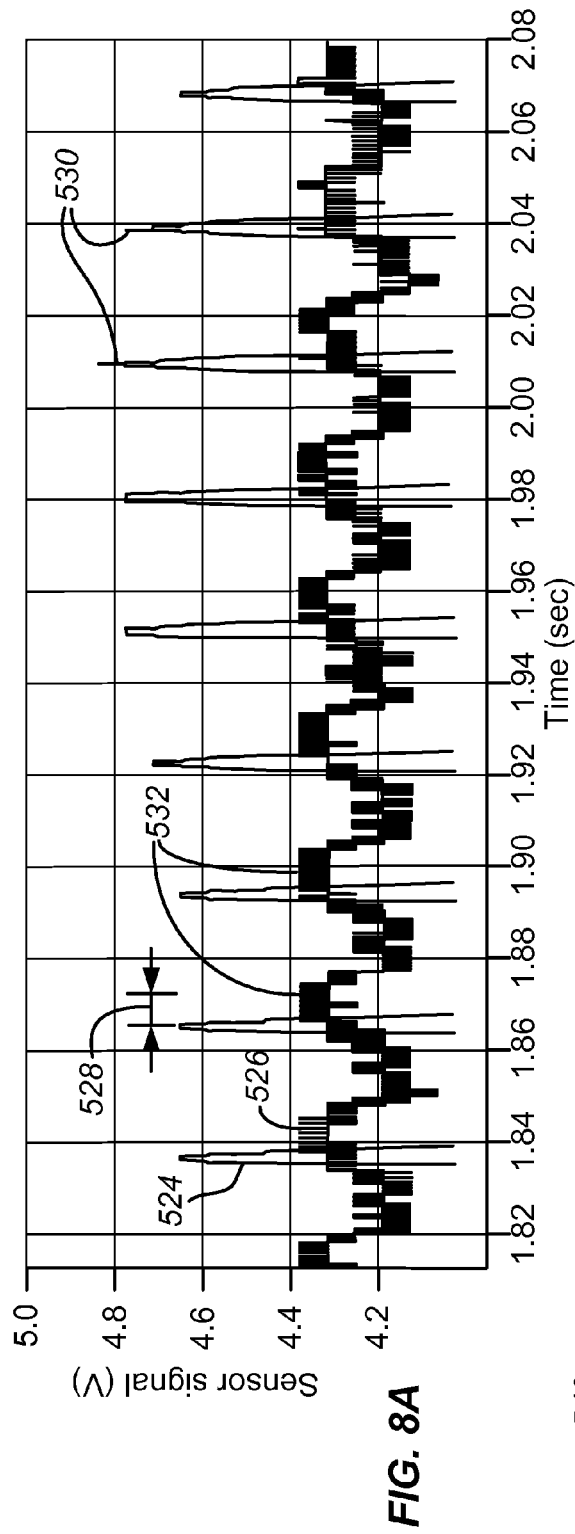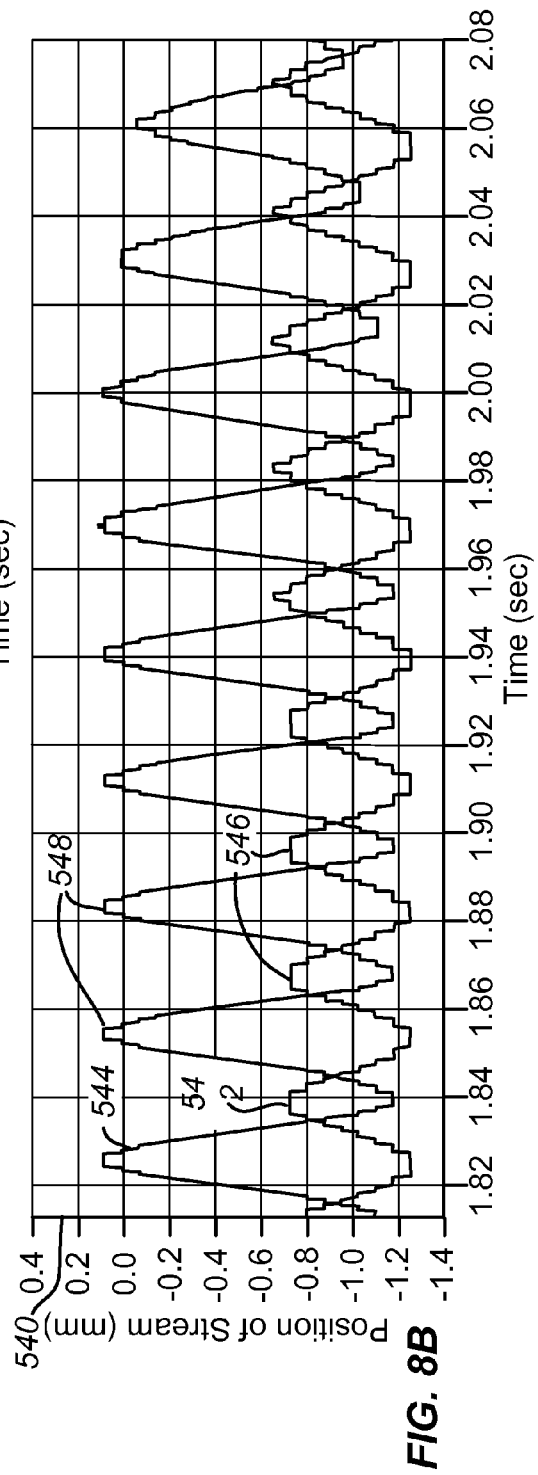
FIG. 8A
FIG. 8B

586

| Run | Setpoint | Measured weight → volume | Inferred volume by integration |
|---|---|---|---|
| | 588 | 590 | 592 594 |
| 1 | 1 mL <u>566</u><br>2 sec | .801 gm<br>= 1.01 mL | 1.14 mL |
| 2 | 2 mL <u>560</u><br>2 sec | 1.677 gm<br>= 2.12 mL | 1.29 mL |
| 3 | 2 mL <u>554</u><br>1 sec | 1.603 gm<br>= 2.03 mL | 2.05 mL |

FIG. 11

METHOD AND SYSTEM TO MEASURE FLOW VELOCITY AND VOLUME

BACKGROUND OF THE INVENTION

The present invention relates generally to the field of substrate processing equipment and methods. More particularly, the present invention relates to a method and apparatus for providing measurement, calibration and control of delivered liquids used to process semiconductors. Merely by way of example, the method and apparatus of the present invention are used to measure, calibrate and control the volume of photoresist, and in some instances the velocity of photoresist, dispensed in a photolithography coating system. The method and apparatus can be applied to other processes for semiconductor substrates, for example those used in the formation of integrated circuits and chemical mechanical polishing.

Modern integrated circuits contain millions of individual elements that are formed by patterning the materials, such as silicon, metal and/or dielectric layers, that make up the integrated circuit to sizes that are small fractions of a micrometer. The technique used throughout the industry for forming such patterns is photolithography. A typical photolithography process sequence generally includes depositing one or more uniform photoresist (resist) layers on the surface of a substrate, drying and curing the deposited layers, patterning the substrate by exposing the photoresist layer to electromagnetic radiation that is suitable for modifying the exposed layer and then developing the patterned photoresist layer.

It is common in the semiconductor industry for many of the steps associated with the photolithography process to be performed in a multi-chamber processing system (e.g., a cluster tool) that has the capability to sequentially process semiconductor wafers in a controlled manner. One example of a cluster tool that is used to deposit (i.e., coat) and develop a photoresist material is commonly referred to as a track lithography tool.

Track lithography tools typically include a mainframe that houses multiple chambers (which are sometimes referred to herein as stations) dedicated to performing the various tasks associated with pre- and post-lithography processing. There are typically both wet and dry processing chambers within track lithography tools. Wet chambers include coat and/or develop bowls, while dry chambers include thermal control units that house bake and/or chill plates. Track lithography tools also frequently include one or more pod/cassette mounting devices, such as an industry standard FOUP (front opening unified pod), to receive substrates from and return substrates to the clean room, multiple substrate transfer robots to transfer substrates between the various chambers/stations of the track tool and an interface that allows the tool to be operatively coupled to a lithography exposure tool in order to transfer substrates into the exposure tool and receive substrates from the exposure tool after the substrates are processed within the exposure tool.

Over the years there has been a strong push within the semiconductor industry to shrink the size of semiconductor devices. The reduced feature sizes have caused the industry's tolerance to process variability to shrink, which in turn, has resulted in semiconductor manufacturing specifications having more stringent requirements for process uniformity and repeatability. An important factor in minimizing process variability during track lithography processing sequences is to ensure that every substrate processed within the track lithography tool for a particular application has the same "wafer history." A substrate's wafer history is generally monitored and controlled by process engineers to ensure that all of the device fabrication processing variables that may later affect a device's performance are controlled, so that all substrates in the same batch are always processed the same way.

A component of the "wafer history" is the thickness, uniformity, repeatability, and other characteristics of the photolithography chemistry, which includes, without limitation, photoresist, developer, and solvents. Generally, during photolithography processes, a substrate, for example a semiconductor wafer, is rotated on a spin chuck at predetermined speeds while liquids and gases such as solvents, photoresist (resist), developer, and the like are dispensed onto the surface of the substrate. Typically, the wafer history will depend on the process parameters associated with the photolithography process.

As an example, an inadequate volume of photoresist dispensed during a coating operation will generally impact the uniformity and thickness of coatings formed on the substrate. Additionally, the dispense rate of the photoresist will generally impact film properties, including the lateral spreading of the resist in the plane of the substrate. In some instances, therefore, it is desirable to control both the volume and dispense rate of the photoresist applied to the substrate with respect to both the accuracy (e.g., total volume per dispense event) and repeatability (e.g., difference in volume per dispense over a series of dispense events) of the dispense process.

Work in relation to the present invention suggests that the "wafer history" can also include the velocity and diameter of an applied photoresist stream. For example, a larger diameter stream moving at a slower velocity toward the substrate can deliver fluid at the same rate as a small diameter stream moving at a higher velocity. The larger diameter stream presents an increased surface area for a longer period of time, thereby resulting in a greater evaporation of fluid during the dispense which can affect the process. Also, droplets falling or separating in the stream of liquid coming from the nozzle can land on a semiconductor wafer. In some instances such drops may result in defects as the drop "skates" over the surface.

For some photolithography chemical dispense applications, manual calibration of the dispense volume of photoresist applied to the substrate has been provided to improve the accuracy and repeatability of the dispense process. For example, manual calibration of dispense volume can be performed by dispensing a controlled volume into a small pre-weighed cup and moving the cup to a gravimetric scale, or by dispensing the controlled volume into a graduated cylinder. However, these manual calibrations do not provide the level of versatility, automation and speed desirable for current and future track lithography tools. Accordingly, further improvements are desired and are continuously sought by process engineers. Therefore, there is a need in the art for improved methods and apparatus for controlling the dispensed liquids in a photolithography system.

SUMMARY OF THE INVENTION

According to the present invention, techniques related to the field of semiconductor processing equipment are provided. More particularly, the present invention provides methods and apparatus for providing measurement, calibration and control of delivered liquids used to process semiconductors. Merely by way of example, the method and apparatus of the present invention are used to measure, calibrate and control the volume of photoresist, and in some instances the velocity of photoresist, dispensed in a photolithography coating system. The method and apparatus can be applied to other processes for semiconductor substrates, for example those used in the formation of integrated circuits and chemical mechanical polishing (CMP).

In a first embodiment of the present invention, a method of measuring a flow of a liquid stream for a semiconductor process is provided. The method includes delivering the stream through a liquid delivery nozzle. The nozzle is adapted to deliver liquid for the semiconductor process. The stream extends from an upstream location to a downstream location beyond the nozzle. The stream is marked at the upstream location and measured at the downstream location to determine the flow.

In a specific embodiment of the present invention, a method of delivering a stream of a semiconductor process liquid to a semiconductor substrate with a liquid delivery nozzle is provided. A perturbation to the stream is provided at a first location in a direction transverse to the flow. The stream is measured at a second location, and the stream is measured at third location. The flow is computed from the stream as measured at the second and third locations.

In another specific embodiment of the present invention, a method of dispensing a stream of a semiconductor processing liquid through a nozzle is provided. Flow characteristics of the stream beyond the nozzle are determined. The liquid is applied to the substrate in response to the flow characteristics.

In some embodiments of the present invention, a device for measuring a flow of a liquid stream from a liquid delivery nozzle is provided. The device includes structure to mark the stream at a first location, and a sensor to measure the stream at a second location downstream from the first location and the nozzle. The sensor generates a signal in response to the structure marking the stream at the first location. The nozzle is capable of delivering liquids for a semiconductor process.

Many benefits are achieved by way of the present invention over conventional techniques. For example, the present technique allows for measuring flow of a free stream of liquid falling after the stream leaves the nozzle, reducing operational cost and providing improved yields. Moreover, embodiments of the present invention provide for increased system reliability and improved failure detection. Embodiments providing these and other benefits will be described in more detail throughout the present specification and more particularly in conjunction with the text below and attached figures.

BRIEF DESCRIPTION OF THE DRAWINGS

FIG. 8A illustrates a graph showing voltage of an upper sensor signal versus time and voltage of a lower sensor signal versus time according to an embodiment of the present invention;

FIG. 8B illustrates a graph showing position of the fluid stream over time at the upper and lower locations as measured with independent cameras to validate and verify the sensor signals of FIG. 7A, according to an embodiment of the present invention;

FIG. 11 illustrates a comparison of delivery volumes as determined by weight to delivery volumes as determined by integration of stream diameter and velocity over time according to an embodiment of the present invention.

DESCRIPTION OF SPECIFIC EMBODIMENTS

According to the present invention, techniques related to the field of semiconductor processing equipment are provided. More particularly, the present invention provides methods and apparatus for providing measurement, calibration and control of delivered liquids used to process semiconductors. Merely by way of example, the method and apparatus of the present invention are used to measure, calibrate and control the volume of photoresist, and in some instances the velocity of photoresist, dispensed in a photolithography coating system. The method and apparatus can be applied to other processes for semiconductor substrates, for example those used in the formation of integrated circuits and chemical mechanical polishing (CMP).

Figure 1:
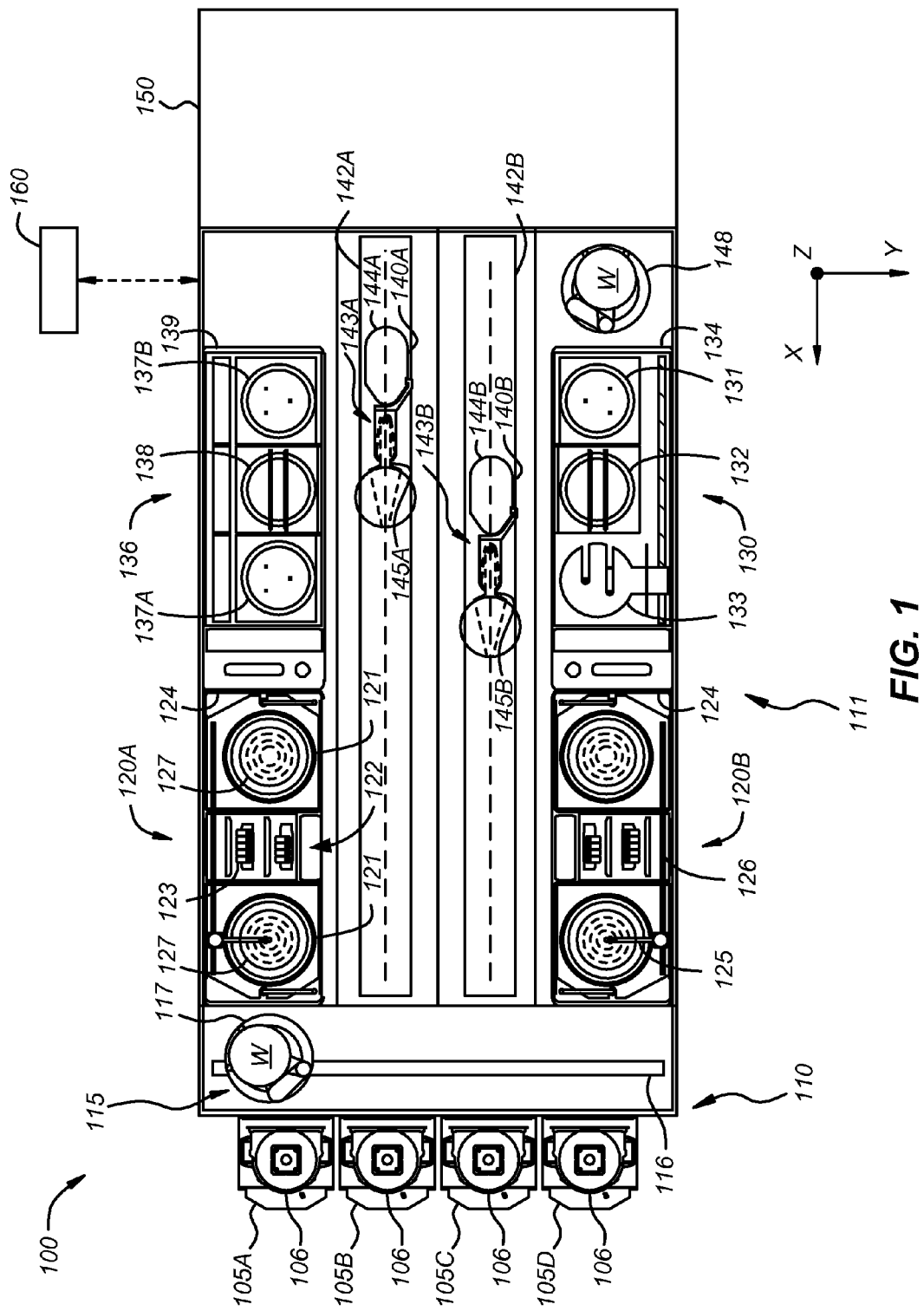
FIG. 1 is a simplified plan view of an embodiment of a track lithography tool according to an embodiment of the present invention.

FIG. 1 is a plan view of an embodiment of a track lithography tool 100 in which the embodiments of the present invention may be used. As illustrated in FIG. 1, track lithography tool 100 contains a front end module 110 (sometimes referred to as a factory interface or FI) and a process module 111. In other embodiments, the track lithography tool 100 includes a rear module (not shown), which is sometimes referred to as a scanner interface. Front end module 110 generally contains one or more pod assemblies or FOUPS (e.g., items 105A-D) and a front end robot assembly 115 including a horizontal motion assembly 116 and a front end robot 117. The front end module 110 may also include front end processing racks (not shown). The one or more pod assemblies 105A-D are generally adapted to accept one or more cassettes 106 that may contain one or more substrates or wafers, "W," that are to be processed in track lithography tool 100. The front end module 110 may also contain one or more pass-through positions (not shown) to link the front end module 110 and the process module 111.

Process module 111 generally contains a number of processing racks 120A, 120B, 130, and 136. As illustrated in FIG. 1, processing racks 120A and 120B each include a coater/developer module with shared dispense 124. A coater/developer module with shared dispense 124 includes two coat bowls 121 positioned on opposing sides of a shared dispense bank 122, which contains a number of nozzles 123 providing processing fluids (e.g., bottom anti-reflection coating (BARC) liquid, resist, developer, and the like) to a wafer mounted on a substrate support 127 located in the coat bowl 121. In the embodiment illustrated in FIG. 1, a dispense arm 125 sliding along a track 126 is able to pick up a nozzle 123 from the shared dispense bank 122 and position the selected nozzle over the wafer for dispense operations. Of course, coat bowls with dedicated dispense banks are provided in alternative embodiments.

Processing rack 130 includes an integrated thermal unit 134 including a bake plate 131, a chill plate 132, and a shuttle 133. The bake plate 131 and the chill plate 132 are utilized in heat treatment operations including post exposure bake (PEB), post-resist bake, and the like. In some embodiments, the shuttle 133, which moves wafers in the x-direction between the bake plate 131 and the chill plate 132, is chilled to provide for initial cooling of a wafer after removal from the bake plate 131 and prior to placement on the chill plate 132. Moreover, in other embodiments, the shuttle 133 is adapted to move in the z-direction, enabling the use of bake and chill plates at different z-heights. Processing rack 136 includes an integrated bake and chill unit 139, with two bake plates 137A and 137B served by a single chill plate 138.

One or more robot assemblies (robots) 140 are adapted to access the front-end module 110, the various processing modules or chambers retained in the processing racks 120A, 120B, 130, and 136, and the scanner 150. By transferring substrates between these various components, a desired processing sequence can be performed on the substrates. The two robots 140 illustrated in FIG. 1 are configured in a parallel processing configuration and travel in the x-direction along horizontal motion assembly 142. Utilizing a mast structure (not shown), the robots 140 are also adapted to move in a vertical (z-direction) and horizontal directions, i.e., transfer direction (x-direction) and a direction orthogonal to the transfer direction (y-direction). Utilizing one or more of these three directional motion capabilities, robots 140 are able to place wafers in and transfer wafers between the various processing chambers retained in the processing racks that are aligned along the transfer direction.

Referring to FIG. 1, the first robot assembly 140A and the second robot assembly 140B are adapted to transfer substrates to the various processing chambers contained in the processing racks 120A, 120B, 130, and 136. In one embodiment, to perform the process of transferring substrates in the track lithography tool 100, robot assembly 140A and robot assembly 140B are similarly configured and include at least one horizontal motion assembly 142, a vertical motion assembly 144, and a robot hardware assembly 143 supporting a robot blade 145. Robot assemblies 140 are in communication with a controller 160 that controls the system. In the embodiment illustrated in FIG. 1, a rear robot assembly 148 is also provided.

The scanner 150, which may be purchased from Canon USA, Inc. of San Jose, Calif., Nikon Precision Inc. of Belmont, Calif., or ASML US, Inc. of Tempe Arizona, is a lithographic projection apparatus used, for example, in the manufacture of integrated circuits (ICs). The scanner 150 exposes a photosensitive material (resist), deposited on the substrate in the cluster tool, to some form of electromagnetic radiation to generate a circuit pattern corresponding to an individual layer of the integrated circuit (IC) device to be formed on the substrate surface.

Each of the processing racks 120A, 120B, 130, and 136 contain multiple processing modules in a vertically stacked arrangement. That is, each of the processing racks may contain more than one stacked coater/developer module with shared dispense 124, multiple stacked integrated thermal units 134, multiple stacked integrated bake and chill units 139, or other modules that are adapted to perform the various processing steps required of a track photolithography tool. As examples, coater/developer module with shared dispense 124 may be used to deposit a bottom antireflective coating (BARC) and/or deposit and/or develop photoresist layers. Stacked integrated thermal units 134 and integrated bake and chill units 139 may perform bake and chill operations associated with hardening BARC and/or photoresist layers after application or exposure.

In one embodiment, a controller 160 that controls the system is used to control all of the components and processes performed in the cluster tool 100. Controller 160 is generally adapted to communicate with the scanner 150, monitor and control aspects of the processes performed in the cluster tool 100, and is adapted to control all aspects of the complete substrate processing sequence. The controller 160, which is typically a microprocessor-based controller, is configured to receive inputs from a user and/or various sensors in one of the processing chambers and appropriately control the processing chamber components in accordance with the various inputs and software instructions retained in the controller's memory. The controller 160 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 160 determines which tasks are performable in the processing chamber (s). Preferably, the program is software readable by the controller 160 and includes instructions to monitor and control the process based on defined rules and input data.

It is to be understood that embodiments of the invention are not limited to use with a track lithography tool such as that depicted in FIG. 1. Instead, embodiments of the invention may be used in any track lithography tool including the many different tool configurations described in U.S. patent application Ser. No. 11/315,984, entitled "Cartesian Robot Cluster Tool Architecture" filed on Dec. 22, 2005, which is hereby incorporated by reference for all purposes and including configurations not described in the above referenced application.

Generally, track lithography tools are used to dispense precise amounts of expensive lithography chemicals onto substrates to form thin, uniform coatings. For modern lithography processes, the volumes of chemicals, such as photoresist, dispensed per event are small, for example, ranging from about 0.5 ml to about 5.0 ml. The volume of chemical dispensed, the flow rate during the dispense operation, among other variables, are controlled during the process of dispensing the lithography chemicals, for example, photoresist. Preferably, control of the dispense operations in a track lithography tool provide actual dispensed volumes with an accuracy of ±0.02 milliliters (ml) and repeatability from dispense event to dispense event of $3\sigma<0.02$ ml.

A wide variety of photolithography chemicals are utilized in track lithography tools according to embodiments of the present invention. For example, photoresist, bottom anti-reflective coating (BARC), top anti-reflective coating (TARC), top coat (TC), Safier, and the like are dispensed onto the substrate. In some embodiments, after the selected chemical is dispensed, the substrate is spun to create a uniform thin coat on an upper surface of the substrate. Generally, to provide the levels of uniformity desired of many photolithography processes, dispense events start with a solid column of chemical. The flow rate is generally set at a predetermined rate as appropriate to a particular chemical deliver process. For example, the flow rate of the fluids is selected to be greater than a first rate in order to prevent the fluids from drying out prior to dispense. At the same time, the flow rate is selected to be less than a second rate in order to maintain the impact of the fluid striking the substrate below a threshold value.

As the dispense event is terminated, the fluid is typically drawn back into the dispense line, sometimes referred to as a suck-back process utilizing a suck-back valve. In some track lithography tools, the fluid is brought back into the dispense line about 1-2 mm from the end of the dispense nozzle, forming a reverse meniscus. This suck-back process prevents the lithography chemicals from dripping onto the substrate and prevents the chemicals from drying out inside the nozzle.

Figure 2:
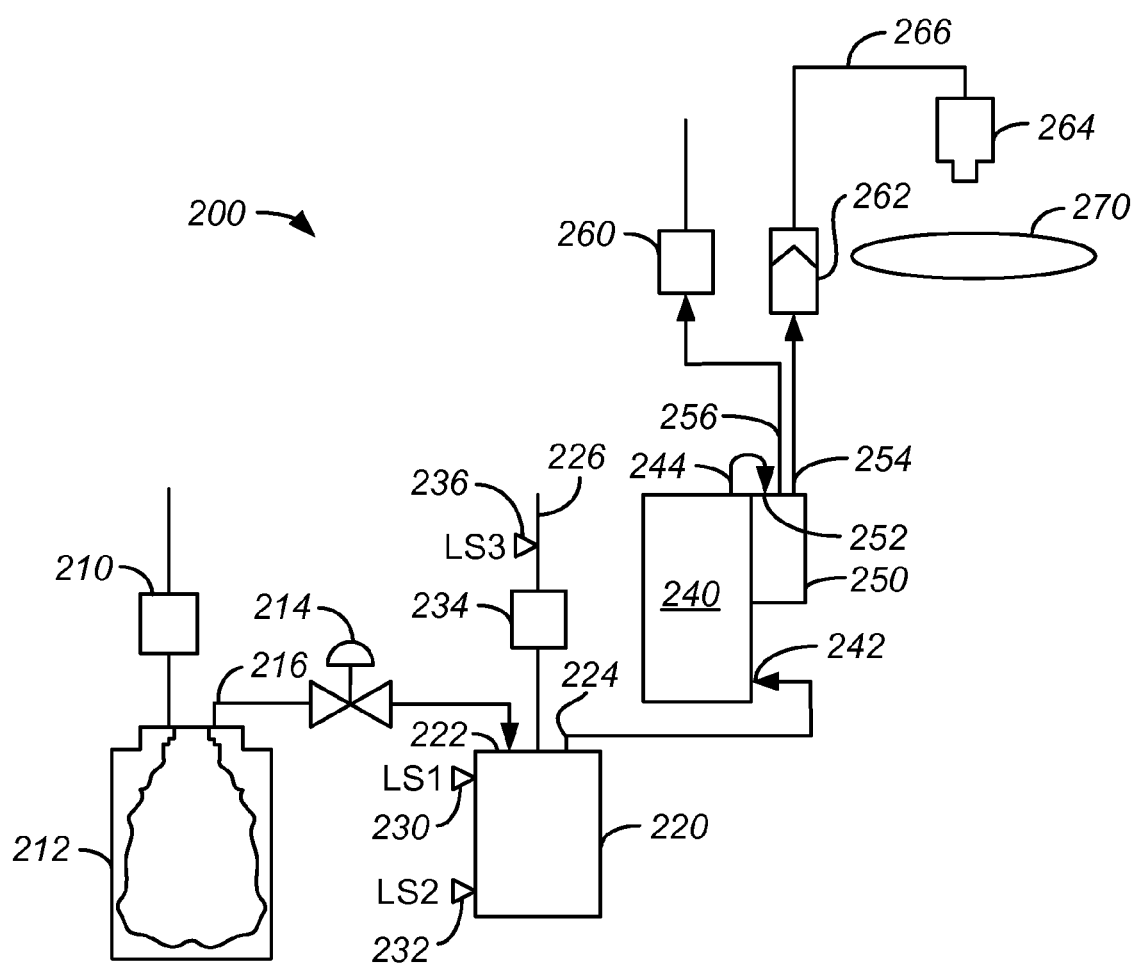
FIG. 2 is a simplified schematic illustration of a photolithography chemical dispense apparatus according to an embodiment of the present invention.

FIG. 2 is a simplified schematic illustration of a photolithography chemical dispense apparatus 200 according to an embodiment of the present invention. A pressure valve 210 is coupled to a source bottle 212 containing the photolithography chemical to be dispensed onto the substrate surface. In an embodiment, the source bottle is a NOWPak® container available from ATMI, Inc., Danbury, Conn. The source bottle is coupled to a flow control valve 214 and adapted to regulate the flow of the photolithography chemical present in fluid line 216. Buffer vessel 220 is illustrated in FIG. 2 and includes an input port 222, an output port 224, and a vent port 226. The input port 222 of the buffer vessel 220 is coupled to the fluid line 216. As illustrated in FIG. 2, the buffer vessel includes a number of level sensors, for example, level sensor LS1 (230) and level sensor LS2 (232). As described more fully below, the level sensors are utilized to regulate the volume of photolithography chemical present in the buffer vessel 220.

The vent port 226 of the buffer vessel is coupled to a vent valve 234 and a level sensor LS3 (236). Level sensor LS3 serves to monitor the level of fluid passing through the vent valve 234. The output port 224 of the buffer vessel is coupled to input port 242 of dispense pump 240. As illustrated in FIG. 2, a filter 250 is integrated with the dispense pump 240 and the output port 244 of the dispense pump is coupled to an input port 252 of the filter 250. A vent port 256 and an output port 254 are provided on the filter 250 and, as illustrated in FIG. 2, a vent valve 260 is coupled to the vent port 256. A shut off/suck-back valve 262 is coupled to the fluid line running from the output port 254 of the filter. A fluid line 266 couples suck back valve 262 with a nozzle 264 to dispense the fluid. From valve 262, the photolithography chemical is delivered to substrate 270 through nozzle 264. As will be evident to one of skill in the art, apparatus adapted to chuck and spin the substrate are not illustrated for purposes of clarity. Furthermore, additional dispense systems adapted to provide photolithography chemicals, e.g., multi-nozzle systems, are not illustrated for purposes of clarity.

Figure 3A:
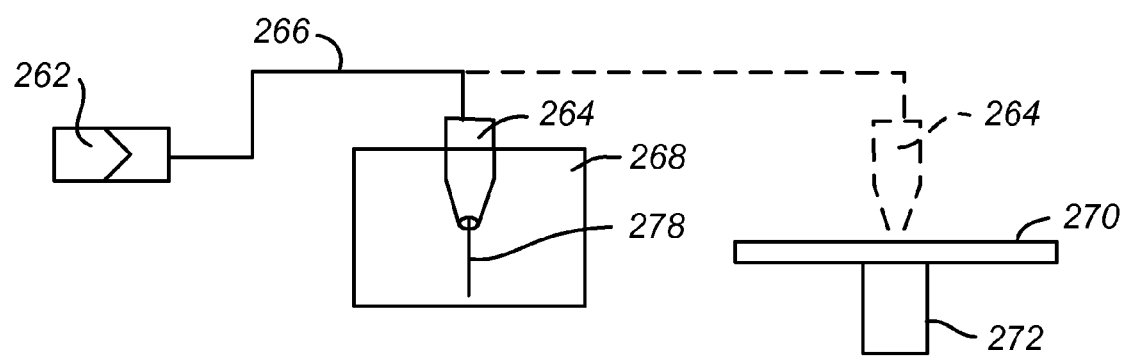
FIG. 3A is a simplified schematic illustration of a calibration station and method of chemical dispense according to an embodiment of the present invention.

FIG. 3A is a simplified schematic illustration of a calibration station 268 and method of chemical dispense according to an embodiment of the present invention. Nozzle 264 is positioned at calibration station 268. A liquid stream 278 is measured at calibration station 268. Although any liquid can be used for calibration, for example, solvents such as water, isopropyl alcohol, acetone and ethanol, calibration is preferably performed with the liquid which is delivered to the substrate, for example, photoresist. The flow characteristics of liquid stream 278 is determined at the calibration station. Any measured flow characteristic can be used to calibrate delivery of liquid stream 278 from nozzle 264, for example flow velocity, flow rate and flow volume. The delivery of liquid is calibrated with the measured flow and can be adjusted in response to the measured flow, for example by changing an actual amount of fluid delivered to more closely match an intended, or planned amount of fluid delivered. After the flow of liquid stream 278 is measured at calibration station 268 and optionally adjusted and calibrated, nozzle 264 is positioned near substrate 270. Substrate 270 is mounted on spin chuck 272. The liquid is delivered to substrate 270 with liquid stream 278 while spin chuck 272 spins substrate 270.

Figure 3B:
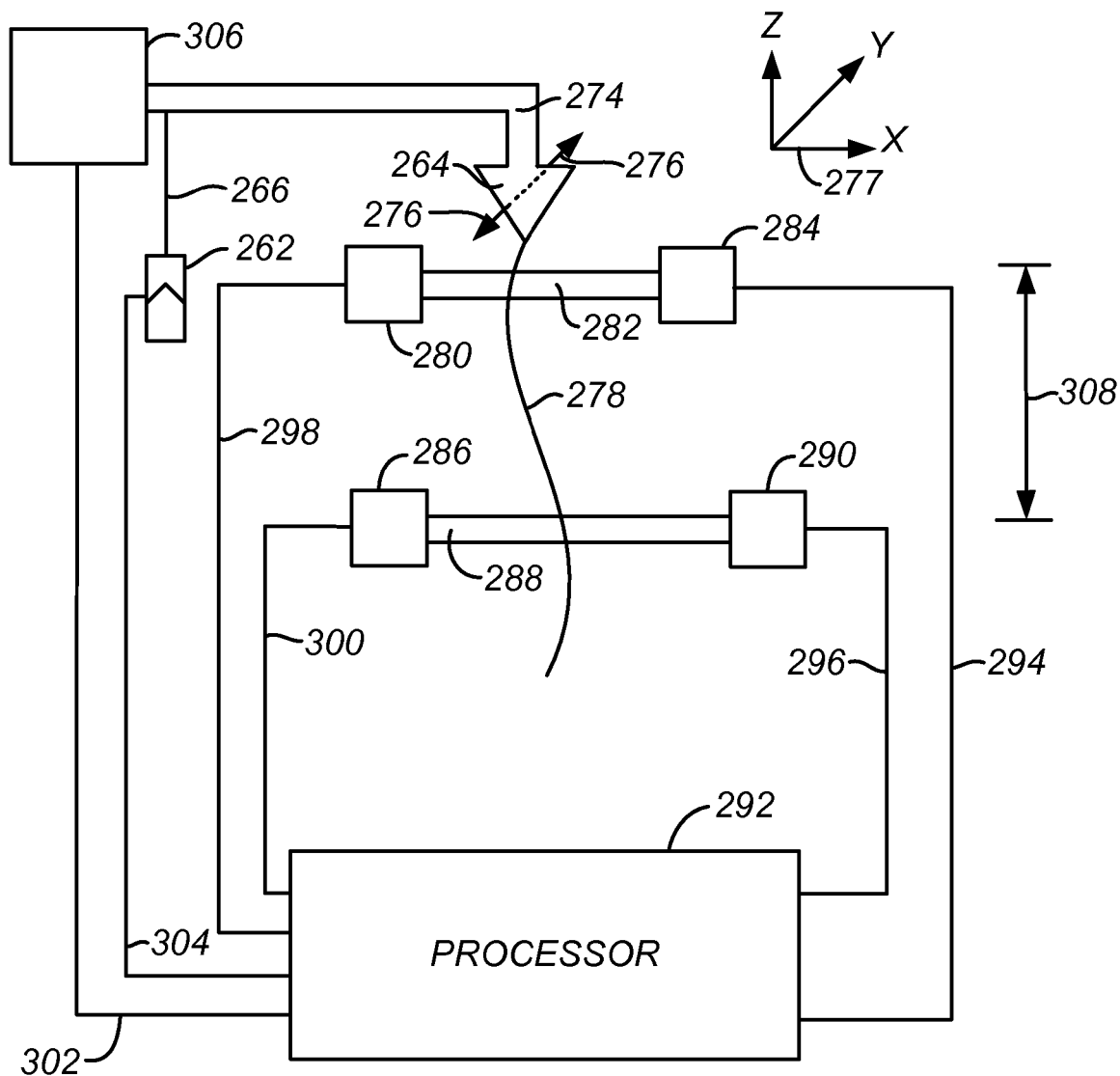
FIG. 3B is a simplified schematic illustration of a device for measuring flow of a fluid stream from a nozzle according to an embodiment of the present invention.

FIG. 3B is a simplified schematic illustration of a device for measuring flow of liquid stream 278 from nozzle 264 according to an embodiment of the present invention. Nozzle 264 provides liquid stream 278 which travels vertically downward along a Z direction of a coordinate reference system 277. Nozzle 264 is attached to arm 274. Arm 274 moves under control of the controller. As shown by arrows 276, arm 274 moves nozzle 264 along the Y direction. Nozzle 264 moves transverse to the direction of flow of liquid stream 278. Transverse movement of nozzle 276 marks liquid stream 278 as the stream flows downward. As shown in FIG. 3B, transverse movement of nozzle 3B marks the stream with a sinusoidal pattern, although any kind of marking which perturbs the flow of the stream can be used. For example, the stream can be marked with a puff of air from a nozzle.

Light sensors are used to measure the position and size of liquid stream 278. An upper light source 280 generates an upper light beam 282 disposed along the X direction. Light beam 282 strikes an upper sensor 284. Liquid stream 278 flows through upper light beam 282. Liquid stream 278 refracts light away from upper sensor 284 so that the amount of light reaching upper sensor 284 correlates with the position of liquid stream 278 at the upper location where the stream refracts the upper light beam. A lower light source 286 generates a lower light beam 288 disposed along the X direction. Lower light beam 288 strikes a lower sensor 290. Liquid stream 278 flows through lower beam 288. Liquid stream 278 refracts light beam 288 away from lower sensor 290 so that the amount of light reaching lower sensor 290 correlates with the position and/or diameter of liquid stream 278 at the lower location where the stream refracts the lower light beam. In some embodiments, the upper light beam and sensor measure the position of a structure, for example the nozzle, to measure marking of the fluid stream at the upstream location. Therefore, it is not necessary that the sensor at the upper location measure the position of the free stream of liquid to measure the marking of the stream at an upstream location.

The flow of liquid stream 278 is determined with a processor 292. Processor 292 is connected to sensors 284 and 290. Processor 292 receives signals from the sensors. While the processor can be any device which modifies an electrical signal, for example a phase comparator, a programmable array logic device or a microcontroller, the processor often comprises at least one microprocessor and a at least one tangible medium for storing instructions for the processor. The tangible medium comprises random access memory (RAM) and can comprise read only memory (ROM), compact disk ROM (CDROM), flash RAM. Processor 292 can comprise a distributed network of computers, for example a local area network, an intranet or Internet. Processor 292 communicates with processor 160, described above, and in some embodiments processor 292 comprises processor 160. Machine readable instructions for performing at least some of the techniques described herein are stored on the tangible medium.

Several flow characteristics of liquid stream 278 are calculated with the processor. For example, the average velocity of the fluid stream traveling between the upper location and the lower location is calculated. In most embodiments, the distance between the upper location and the lower location (d) is known, for example a separation distance 308 as shown in FIG. 3B. The time delay or latency $\Delta t$, can be determined by marking the stream as described herein. The time delay from the time the marked stream is detected with the upper sensor until the marked stream is detected with the lower sensor is inversely proportional to the average velocity of the stream between the upper and lower locations. The average velocity (v) of the stream can be calculated from the well known equation $(v)=(d)/(\Delta t)$. As the stream is marked with a periodic function having a period T, the time delay $\Delta t$ is calculated from a phase angle $\Theta$ with the formula $\Delta t=T*(\Theta/2\pi)$. The diameter and position of the stream at the lower location is calculated from the measured intensity of the lower light beam. The cross sectional area of the stream is calculated from the diameter of the stream assuming that the stream is circular. This assumption is generally valid for a nozzle with a circular channel formed therein. The flow rate of the stream is calculated from the product of the velocity of the stream and the cross sectional area of the stream to provide a volume of fluid delivered per unit time. The flow rate of the stream is integrated over time to determine the volume. Thus, the volume of the stream is calculated from integrating the cross sectional area and the velocity of the stream over time. The variation in diameter of the stream over time is evaluated to detect break up of the fluid stream into drops and to detect the presence of gas bubbles in the stream.

The processor controls the delivery of the fluid stream and light sources. Upper light source 280 and lower light source 286 are selectively controlled by the processor. Control line 298 transmits commands from processor 292 to upper light source 280, and control line 300 transmits commands from processor 292 to lower light source 286. Processor 292 is connected to suck back valve 262 with a control line 304 and controls delivery of the fluid stream. Arm 274 is supported with a linkage 306. Linkage 306 is driven with a motor under control of processor 292. Processor 292 controls the position of arm 274 and transmits control commands over a control line 302 to linkage 306. Processor 292 moves nozzle 264 with a controlled motion to mark the stream to measure the flow of liquid stream 278, for example controlled motion to mark the stream with a sinusoidal pattern. In some embodiments, the stream is marked with vibration of the nozzle generated from other components of the track system which occurs through normal use. In an embodiment, a motor rotates a shaft having an eccentric weight mounted thereon which generates a vibration to mark the stream at the frequency of rotation of the eccentric shaft.

Figure 4A:
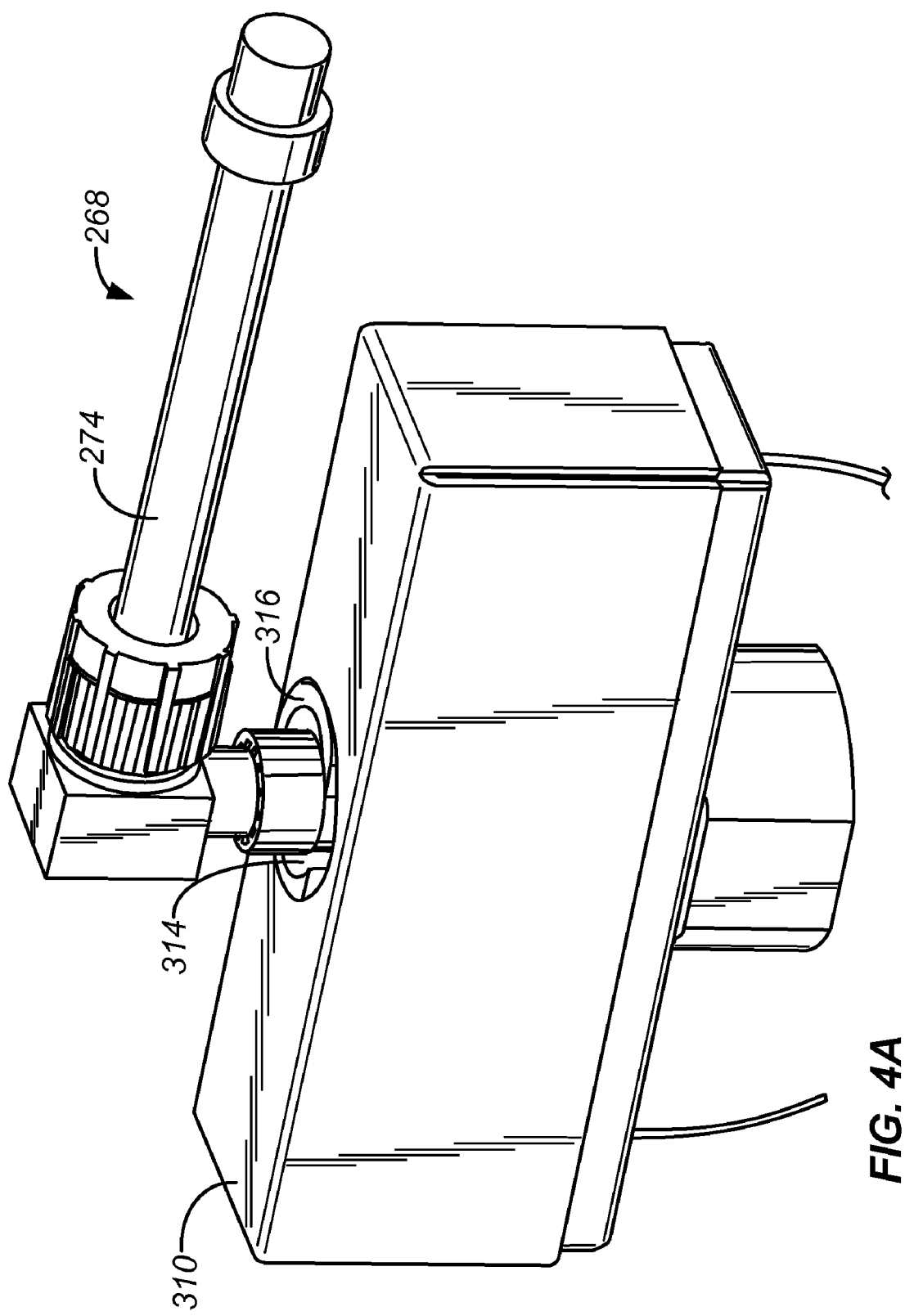
FIGS. 4A, 4B and 4C are simplified illustrations of a calibration station for measuring flow of a fluid stream from a nozzle according to an embodiment of the present invention.
Figure 4B:
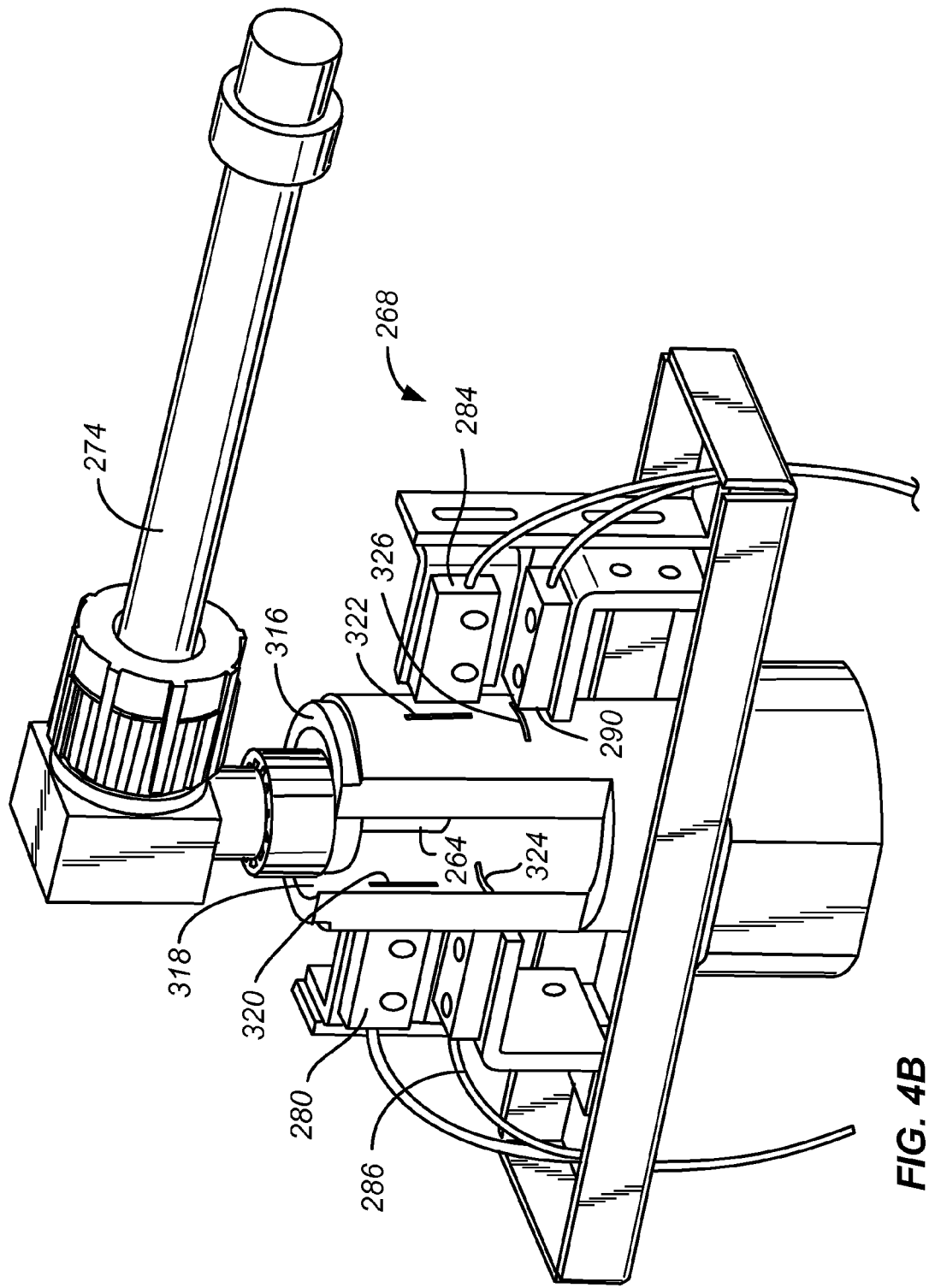
Figure 4C:
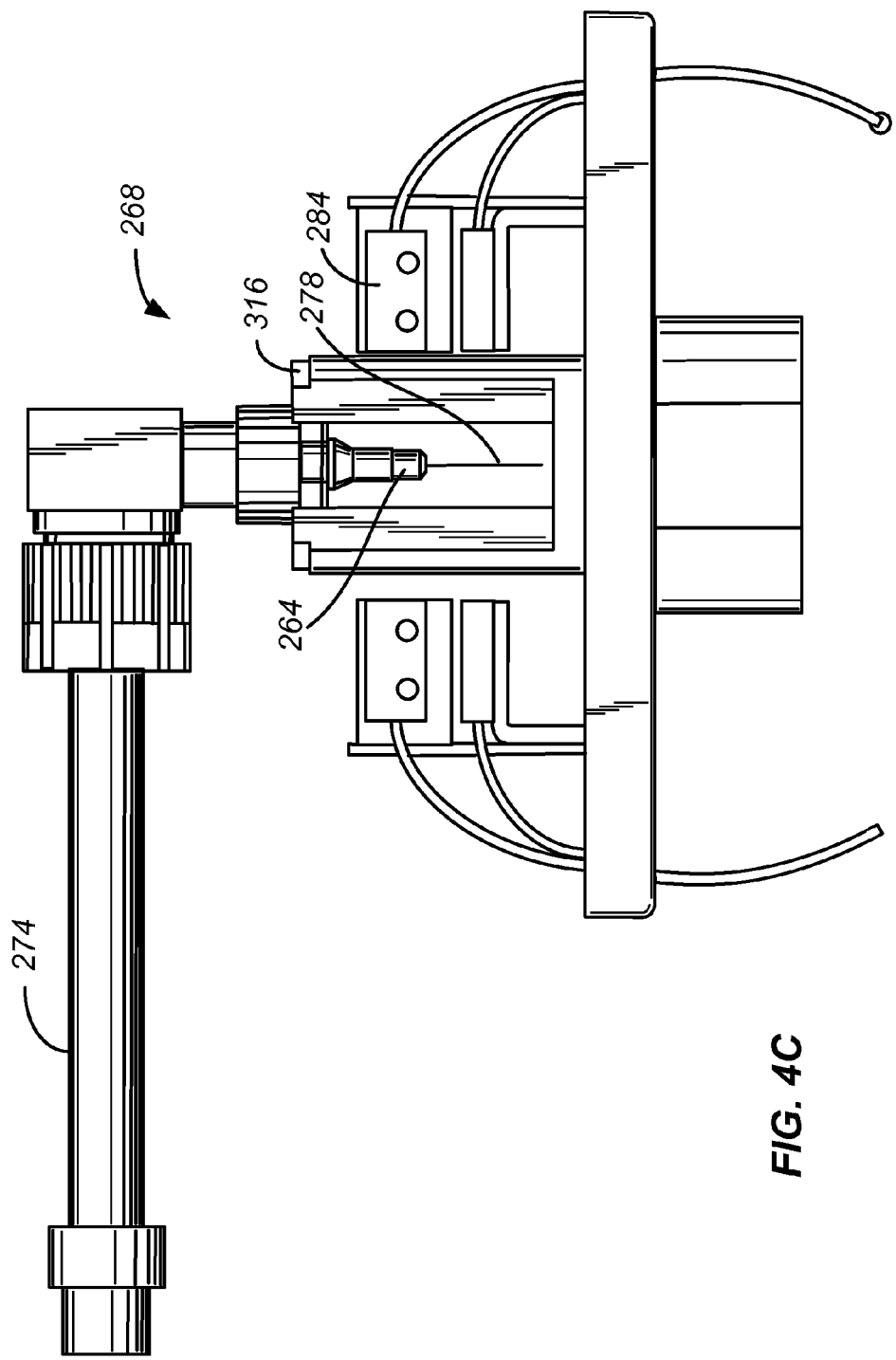

FIGS. 4A, 4B and 4C are simplified illustrations of calibration station 268 for measuring flow of the liquid stream 278 from nozzle 264 according to an embodiment of the present invention. Calibration station 268 includes a cover 312 to protect components of the calibration station. Cover 312 includes an opening 314. Nozzle 264 is inserted into opening 314 during measurement of the fluid stream. Arm 274 moves the nozzle to the calibration station under control of the processor as described above. A protective annular structure 316 is provided to protect components of the calibration station from gas vapor emitted from the stream. Annular structure 316 has an opening 318, and annular structure 316 protects components of the calibration station from gases, for example gases from the liquid stream. Nozzle 264 is inserted into opening 318 during calibration.

Referring now to FIG. 4B, the upper light source, sensor and windows are arranged to detect marking of the stream. An upper light source window 320 is formed in annular structure 316 to permit light from upper light source 280 to travel to the fluid stream. An upper sensor window 322 is formed in annular structure 316 to permit light to reach the upper sensor from the stream. Upper light source window 320 and upper sensor window 322 are rectangular with a long axis oriented vertically. The fluid stream refracts light so that the amount of light traveling through upper sensor window 322 to upper sensor 284 changes as the stream moves transverse to the flow as described above. The upper sensor is used to detect marking of the stream, the timing of the marking of the stream and/or passage of the marked stream, and this vertical orientation is sufficient to permit detection of the marking of the stream, for example where the stream is marked with a sinusoidal pattern as described above. In addition to detection of marking of the stream, this vertical orientation of the source, windows and sensor can also provide measurement of suck back of the fluid at the nozzle.

The lower light source, sensor and window are arranged to measure the size and position of the stream and also to detect passage of the marked stream. A lower light source window 324 is formed in annular structure 316 to permit light from lower light source 286 to travel to the fluid stream. A lower sensor window 326 is formed in annular structure 316 to permit light to reach the lower sensor. The lower windows 324 each have a long axis oriented horizontally to measure the position and size of the fluid stream at the lower location as is described in more detail herein below. The light beam has a light intensity profile which varies across the window so that the intensity of light reaching the lower sensor changes in correlation with the position of the fluid stream and the size of the fluid stream. The upper and lower light sources and sensors can be made from the same components, with the components and internal structures rotated horizontally or vertically to correspond with the windows.

Figure 4D:
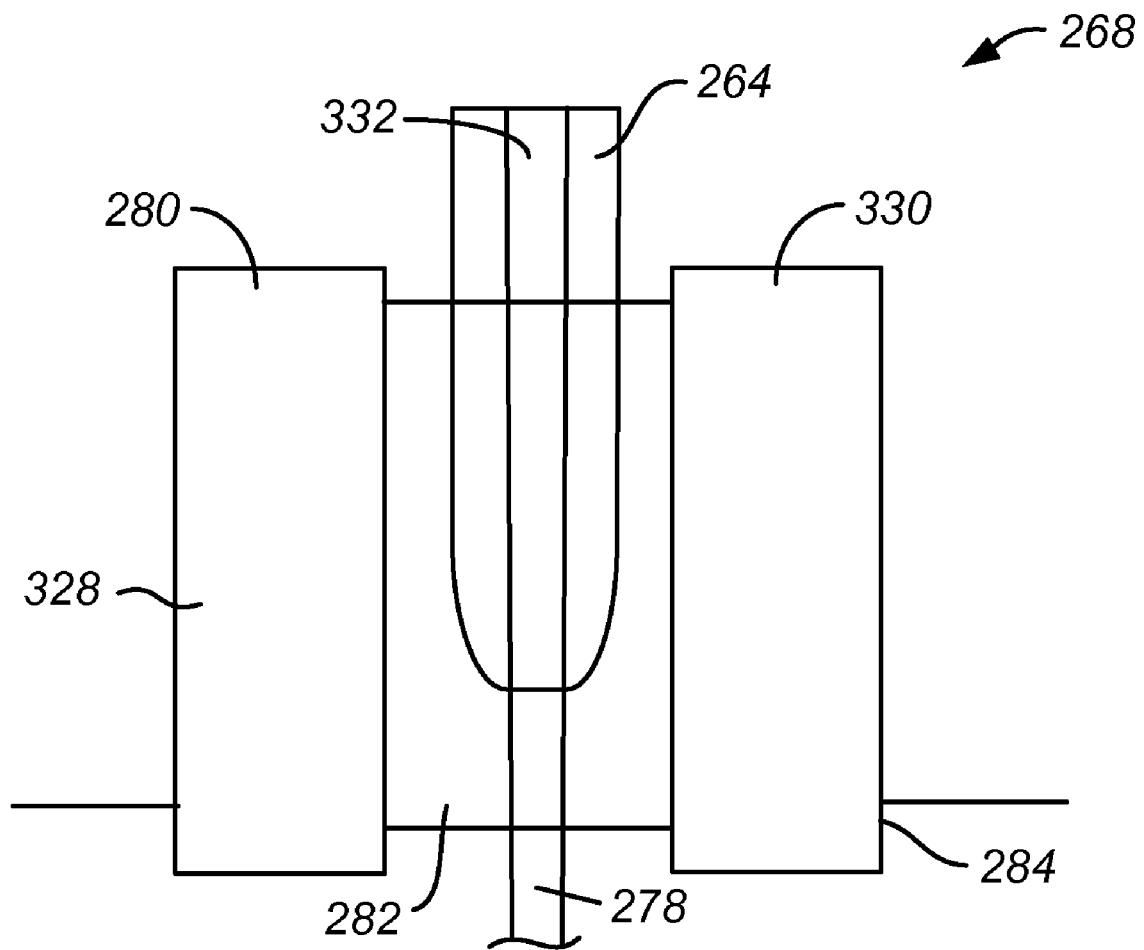
FIG. 4D is a simplified illustration of a light source and a sensor for measuring a fluid stream in which the optical sensors are positioned near the stream at a calibration station according to an embodiment of the present invention.

FIG. 4D is a simplified illustration of light source 280 and upper sensor 284 for measuring the fluid stream in which the light sensors are positioned near the stream at a calibration station according to an embodiment of the present invention. Light source 280 includes a light emitting array 328 comprising several optical fibers having light emitting ends arranged in a vertical row. The light emitting ends are positioned near the nozzle. While any spacing between fibers and any number of fibers can be used in the light emitting array, 16 fibers having a center to center spacing of 350 microns can produce useful results. In an alternate embodiment, a light emitting array comprises several light emitting diodes (LEDs) arranged in a vertical row to emit light near the nozzle. Upper sensor 284 includes a light receiving array 330 of several optical fibers. The light receiving ends of the optical fibers of light receiving array 330 are arranged in a vertical row. The light emitting ends of the optical fibers of light receiving array 330 are coupled to a photodiode and can be coupled to any light sensing transducer, for example as described herein below. The number and spacing of the fibers in light receiving array 330 are typically similar to light emitting array 328. In an alternate embodiment, the light receiving array comprises an array of photodiodes or photodetectors arranged in a vertical row.

Figure 5A:
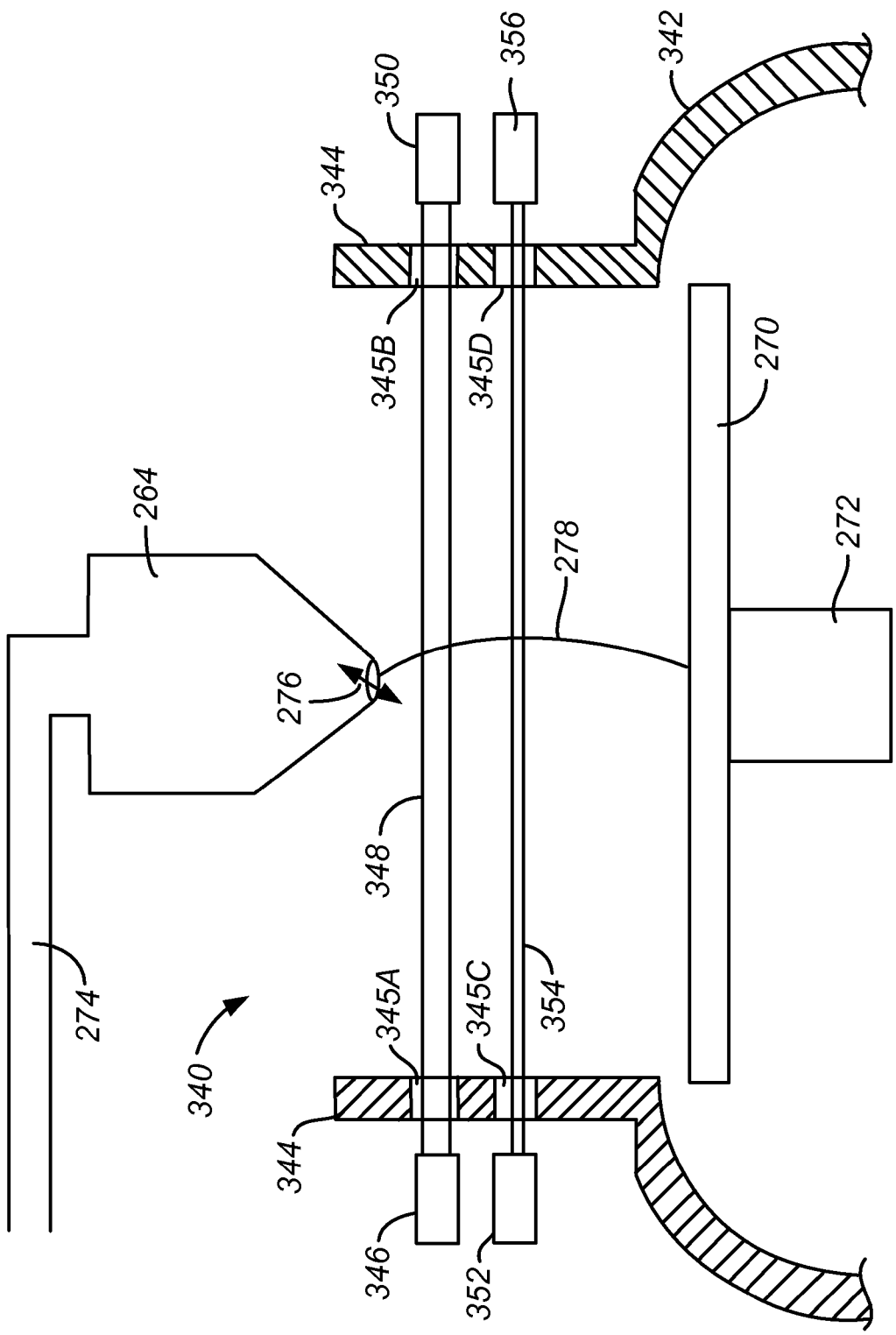
FIG. 5A shows a simplified illustration of a device for measuring fluid flow of a stream with a nozzle positioned over a semiconductor substrate in which the light sources and sensors are positioned away from the stream according to an embodiment of the present invention.

FIG. 5A shows a simplified illustration of a device 340 for measuring flow of liquid stream 278 with nozzle 264 positioned over substrate 270 in which light sources and sensors are positioned away from the stream according to an embodiment of the present invention. An upper light source 346 is positioned near an annular protective structure 344. Annular protective structure 344 is supported with spin bowl 342. Annular protective structure 344 has a rectangular upper window 345A, a rectangular upper window 345B, a rectangular lower window 345C and a rectangular lower window 345D formed therein. Upper light source 346 generates an upper collimated light beam 348. Collimated light beam 348 passes through upper windows 345A and 345B to an upper sensor 350. Upper rectangular windows 345A and 345B are oriented vertically as described above. Upper collimated light beam 348 is shaped as a thin sheet of light oriented vertically. Lower light source 352 generates a lower collimated light beam 354. Lower collimated light beam 354 passes though lower rectangular windows 345C and 345D to a lower sensor 356. Lower rectangular windows 345C and 345D are oriented horizontally as described above. Lower collimated light beam 354 is shaped as a thin sheet of light oriented horizontally. To measure the flow of the stream, nozzle 264 is moved to mark the liquid stream as described above while the semiconductor process fluid is delivered to the substrate with the fluid.

Figure 5B:
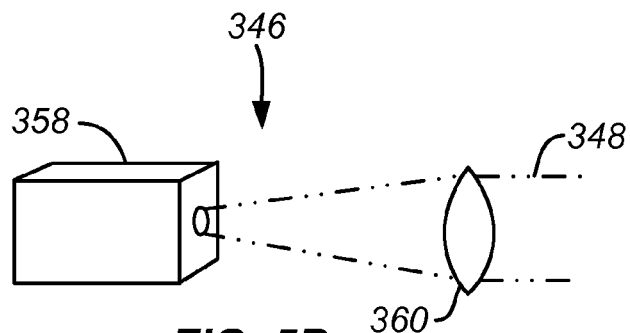
FIG. 5B shows a simplified illustration of a light source for measuring a fluid stream in which the light source is positioned away from the stream according to an embodiment of the present invention.

FIG. 5B shows a simplified illustration of upper light source 346 for measuring the fluid stream in which the light source is positioned away from the stream according to an embodiment of the present invention. Upper light source 346 comprises a laser diode 358 and collimation lens 360. Collimation lens 360 is optically coupled to laser diode 358 to collimate the light emitted from the laser diode and form upper collimated light beam 348. In some embodiments, the light source comprises cylindrical lenses to shape the collimated laser beam to a desired energy profile distribution. While a laser diode is shown, any light source can be used for example halogen light sources, diodes, gas lasers and the like. While infrared, visible and ultraviolet wavelengths of light can be used in some embodiments, visible light having wavelengths between 450 and 650 nm permits visual alignment of the system. While wavelengths shorter than 450 nm can be used, such wavelengths can initiate photochemical reactions with photoresist. While infrared wavelengths may require the use of special viewing equipment for optical alignment, such wavelengths transmit through photoresist and other process chemicals and generally do not initiate photochemical reactions. A laser diode and optics to collimate the laser beam are commercially available as Sunx sensors from Sunx/Ramco of West Des Moines, Iowa and also available as Omron sensors from OB & T (Ohio Belting and Transmission) of Toledo, Ohio.

Figure 5C:
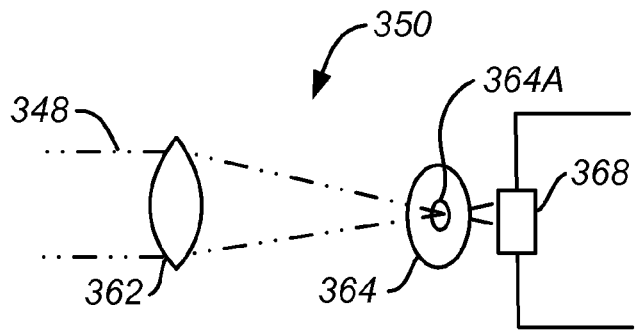
FIG. 5C shows a simplified illustration of a light sensor for measuring a fluid stream in which the sensor is positioned away from the fluid stream and an aperture limits a light acceptance angle.

FIG. 5C shows a simplified illustration of upper sensor 350 for measuring the fluid stream in which the sensor is positioned away from the fluid stream. Sensor 350 comprises a focus lens 362, a non-transmitting plate 364 having an aperture 364A formed therein, and a photo diode 368. Focus lens 362 focuses collimated light to pass through aperture 364A. While aperture 364A is shown with a circular form, the aperture can be any shape, for example a rectangle. Light passing through the aperture illuminates the photo diode to generate a measurement signal. A portion of the light beam which passes through the stream at an angle is refracted by the stream. Light which is refracted at a large angle does not enter focus lens 362. Light which is refracted at a lesser angle can enter focus lens 362 at an angle such that this light does not pass through the aperture in non-transmitting plate 364. While a photodiode is shown, the light sensor can comprise any light sensing transducer capable of generating a signal to measure light energy, for example phototransistors, pyro-electric sensors, photomultiplier tubes, avalanche photo diodes, line scan and area scan charged coupled devices (CCD's), conducting metal oxide semiconductor (CMOS) sensors, and the like. A sensor comprising focusing optics and a light sensing transducer/sensor is commercially available from Sunx and Omron.

Figure 5D:
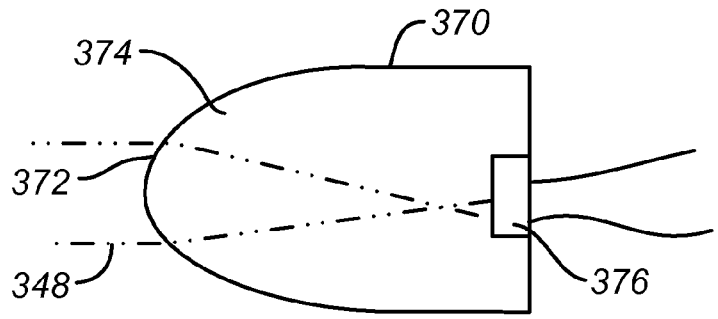
FIG. 5D shows a simplified illustration of a light sensor for measuring a fluid stream in which the sensor has a limited surface area to limit a light acceptance angle

FIG. 5D shows a simplified illustration of a light sensor 370 for measuring a fluid stream comprising a photo diode sensor 376 with a limited surface area to limit a light acceptance angle according to an embodiment of the present invention. Sensor 370 includes a focus lens 372 formed in a light transmissive material, for example plastic material. Photo diode sensor 376 is embedded in transmissive plastic material 374. In some embodiments the sensor comprises a commercially available phototransistor and/or photodiode with a T1 type packaging and a narrow light acceptance angle.

Figure 5E:
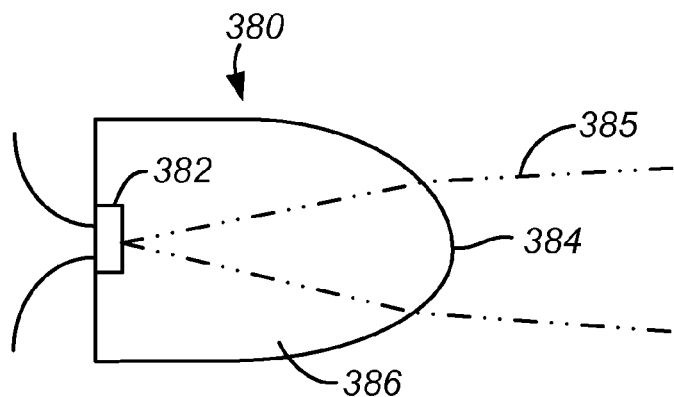
FIG. 5E illustrates a light source according to an embodiment of the present invention.

FIG. 5E illustrates a light source 380 according to an embodiment of the present invention. Light source 380 includes a convex lens 384 formed in a light transmissive material 386, and photodiode 382. Light transmissive material 386 transmits light energy generated by photodiode 382. Light transmitted through material 384 is refracted by convex lens 384 to form light beam 385. Convex lens 384 comprises a condenser and/or collimation lens which decreases separation of the light beam as the light beam travels past the stream to the sensor. Although light beam 385 diverges and increases in size as the light beam is transmitted from the source to the sensor, convex lens 384 decreases the separation of the light beam so that the beam is readily measured at the sensor, even where the separation distance from the source to the sensor is large, for example one meter. The light source can comprise a commercially available LED, for example an LED with TI packaging.

Figure 6A:
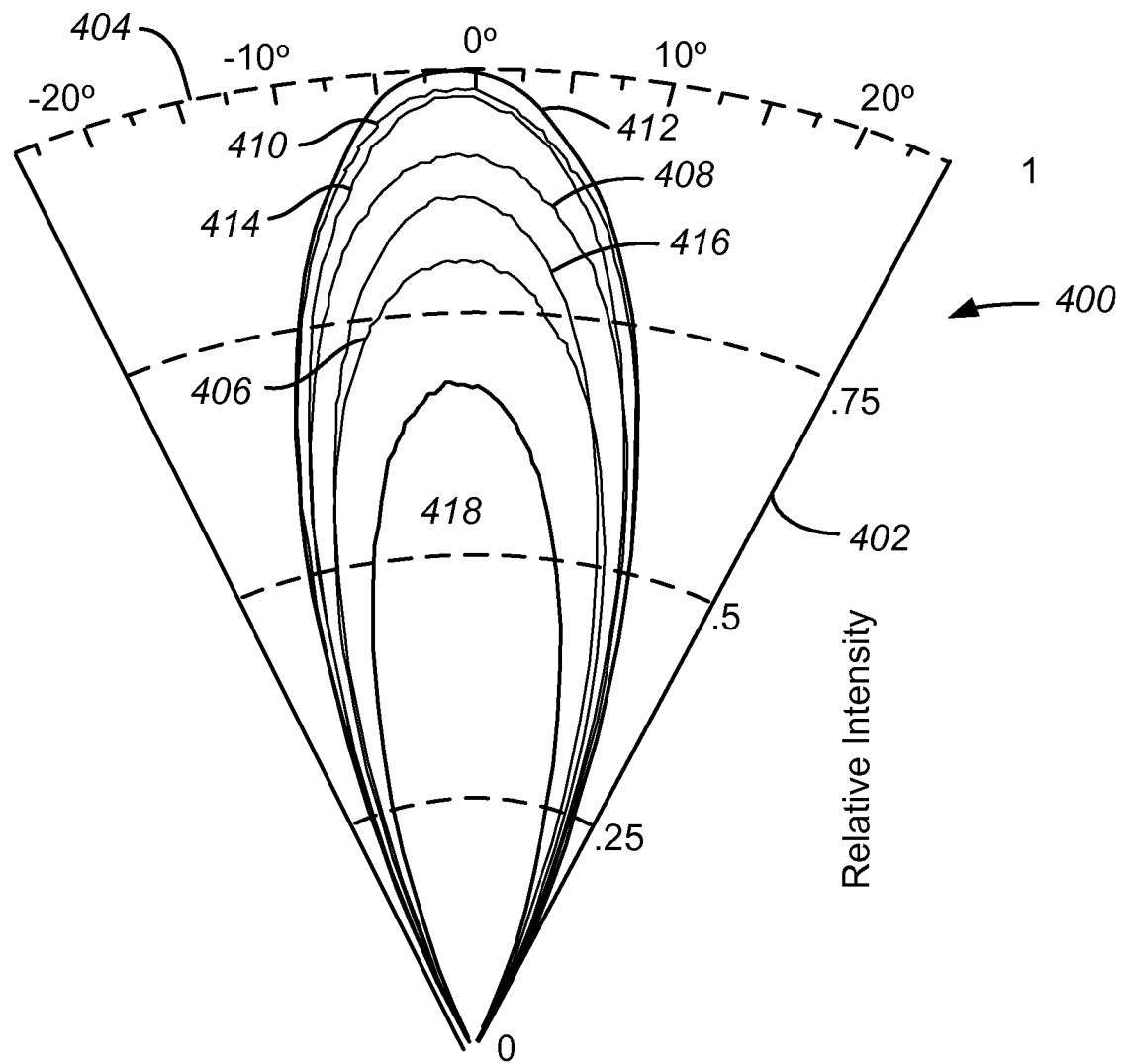
FIG. 6A illustrates a two dimensional light beam intensity profile of a light source according to an embodiment of the present invention.

FIG. 6A illustrates a two dimensional light beam intensity profile 400 of a light source according to an embodiment of the present invention. Light beam intensity profile 400 includes a relative intensity 402 and a horizontal angle 404. Intensity profile 400 is shown for vertical angles of 15, 10, 5, 0, −5, −10 and −15 (degrees) as profiles 406, 408, 410, 412, 414, 416, 418, respectively. Each light beam intensity profile for each vertical angle is shown along horizontal angle 404. As can be seen in FIG. 6A, two dimensional intensity profile 400 is strongest near 0 degrees along horizontal angle 404 for each vertical profile shown. Among the profiles for each vertical angle, the relative intensity is strongest for profile 412 having vertical angle of zero.

Figure 6B:
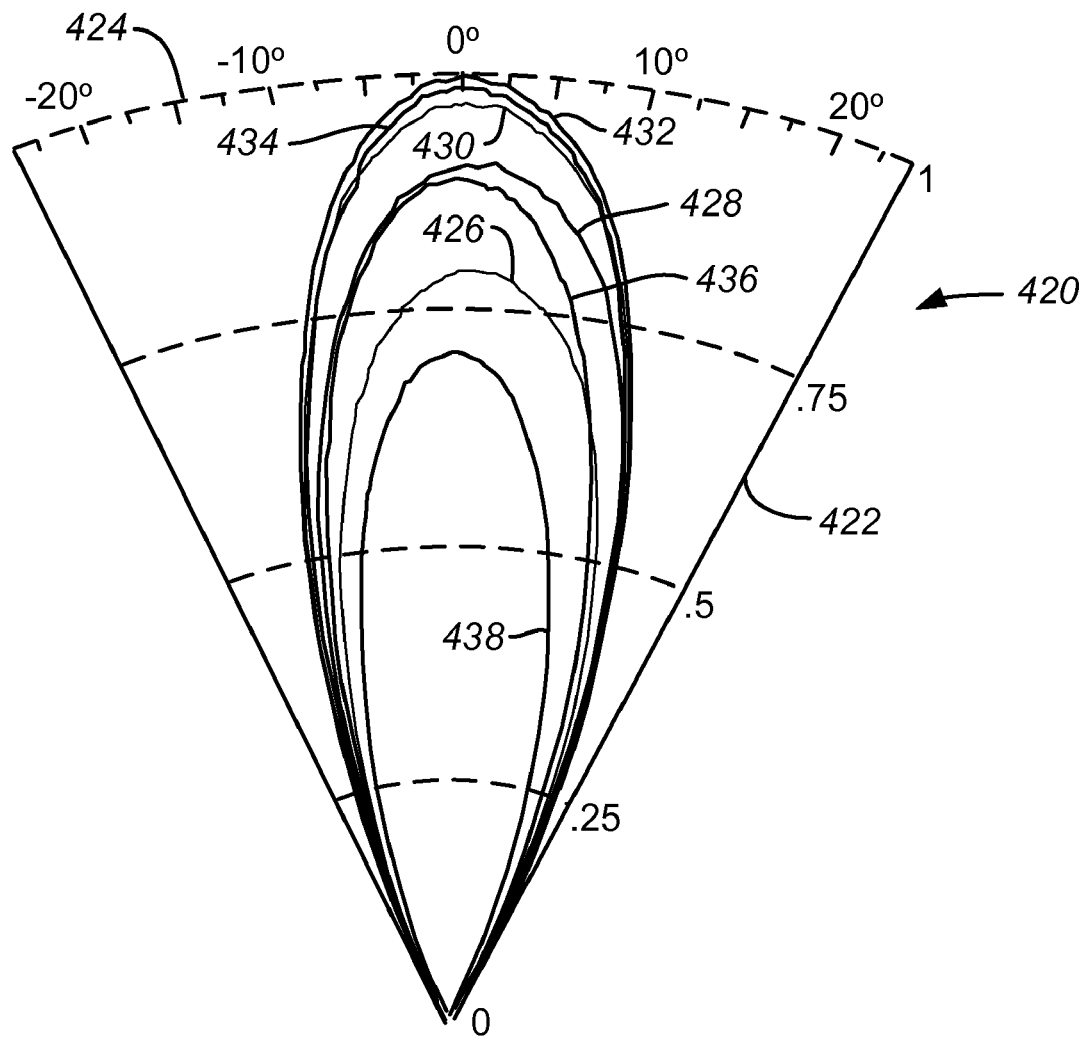
FIG. 6B illustrates a two dimensional light acceptance angle profile of a light receiving sensor according to an embodiment of the present invention.

FIG. 6B illustrates a two dimensional light acceptance angle profile 420 of a light receiving sensor according to an embodiment of the present invention. Light acceptance angle profile 420 includes a relative intensity 422 and a horizontal angle 424. Acceptance angle profile 420 is shown for vertical angles of 15, 10, 5, 0, −5, −10 and −15 (degrees) as profiles 426, 428, 430, 432, 434, 436, 438, respectively. Each light acceptance angle profile for a given vertical angle is shown along horizontal angle 424. As can be seen in FIG. 6B, relative intensity 422 of two dimensional light acceptance angle profile 420 is strongest near 0 degrees along horizontal angle 424 for each vertical profile shown. Among the profiles shown for each vertical angle, relative intensity 422 is strongest for profile 432 having vertical angle of zero.

Figure 7A:
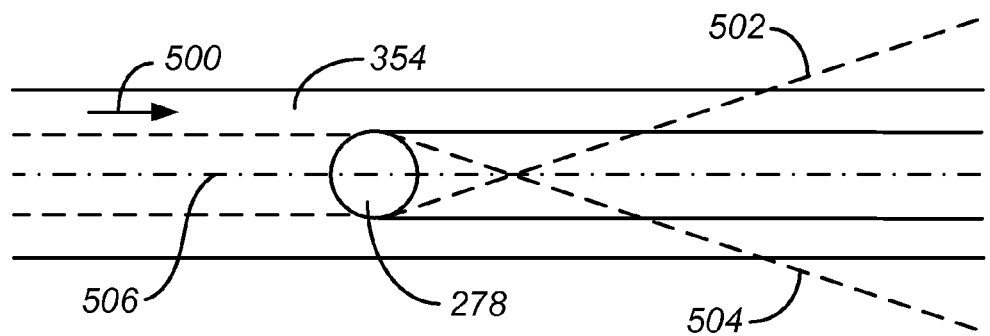
FIG. 7A shows a lower light beam to measure a diameter and position of a fluid stream in which the stream is centered in the light beam while the stream is in a default position according to an embodiment of the present invention.

FIG. 7A shows lower collimated light beam 354 and liquid stream 278 in which the stream is centered in the light beam, for example while the stream is in a default position according to an embodiment of the present invention. Arrow 500 shows the direction of the light beam transmission as the light beam travels past the fluid stream. Liquid stream 278 refracts the light beam so that ray 502 and ray 504 of lower collimated light beam 354 are refracted away from the sensor. In some instances, a central ray 506 may reach the sensor. However, as most of the central portion of the light beam is refracted at some angle, the central portion of the light beam is substantially refracted away from the sensor so that most of the central portion of the light beam does not reach the sensor. As the central portion of the light beam is refracted away from the sensor, the amount of light energy reaching the sensor decreases in response to the stream refracting the light beam.

The sensor can be used to measure the amount of non-refracted light energy transmitted past the stream to determine the size of the stream. As can be seen in FIG. 7A, the amount of light energy reaching the sensor from the beam changes in relation to the diameter of liquid stream 278. With a larger stream, less light energy reaches the sensor because more light is refracted away from the sensor. With a smaller stream, less light energy is refracted away from the sensor so that more light energy reaches the sensor. The sensor can be calibrated to measure the diameter of the stream. For example, annular rods of known diameter can be placed in the path of the light beam and the amount of light energy reaching the sensor measured. This calibration process can be repeated with several rods of known diameter. The diameter of the stream can be determined for a given sensor measurement using interpolation from the values measured with the annular rods of known diameter.

Figure 7B:
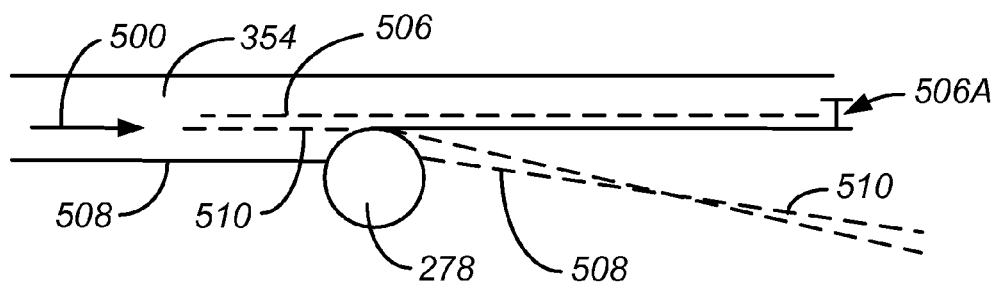
FIG. 7B shows a lower light beam to measure a diameter and position of a fluid stream in which the stream is offset in the light beam according to an embodiment of the present invention.

FIG. 7B shows lower collimated light beam 354 and liquid stream 278 with the stream offset in the light beam according to an embodiment of the present invention. Liquid stream 278 is offset in lower collimated light beam 354 so that marginal light ray 508 and non-central light ray 510 are refracted away from the sensor. Central ray 506 and a central portion 506A of the beam adjacent to this ray are not refracted at an angle so that central potion 406A of the beam reaches the sensor. As the central potion of the beam has the highest relative energy intensity as described above, this transmission of the central beam past the stream to the sensor results in a stronger light energy signal as compared to the centered stream as shown in FIG. 7A.

The upper light beam and stream configured similarly to the lower stream. The upper light beam can be rotated vertically as shown above.

FIG. 8A illustrates a graph showing voltage from an upper sensor signal 524 versus time and voltage of a lower sensor signal 526 versus time according to an embodiment of the present invention. The upper and lower sensor signals have a phase shift 528 which can be compared to determine velocity of a liquid stream according to an embodiment of the present invention. Upper sensor signal 524 includes peaks 530. Lower sensor signal 526 includes peaks 532. Comparison of the signals to determine the phase shift, or phase angle can be made in any number of ways including comparison of the Fourier transform spectra of the two signals. The velocity of the free stream falling between measurement locations is calculated from the phase angle and distance between sensor locations as described above.

FIG. 8B illustrates a graph showing position of the fluid stream over time at the upper and lower locations as measured with independent cameras to validate and verify the sensor signals of FIG. 7A, according to an embodiment of the present invention. An upper location signal 542 corresponds to the position of the edge of the fluid stream at the upper location as measured with a high speed digital camera. A lower position signal 544 corresponds to the position of the edge of the fluid stream at the lower location. The positions of the stream can correspond to any feature of the stream, for example an edge of the free stream falling between the upper and lower measurement locations. Upper location signal 542 includes peaks 546, and lower location signal 444 includes peaks 548. A comparison of these signals shows that the position of the liquid stream as measured with the digital camera agrees with the position of the stream as measured with the upper and lower sensors. Although, peaks 548 from lower location signal 444 are inverted in relation to peaks 532 of lower sensor signal 526, this inversion is the result of the coordinate system used and can be readily be corrected if desired, for example by multiplying either signal by negative 1. Any fluid having properties similar to photoresist, for example isopropyl alcohol (IPA) can be used to test and evaluate the sensors. Any high speed digital camera can be used to perform this analysis, for example 1000 frame per second digital cameras available from Dalsa of Waterloo, Ontaria, Canada and Redlake of San Diego, Calif.

The embodiment of FIG. 8A includes a free stream which is offset in the upper and lower light beams while the stream oscillates and other embodiments can be used, for example where the stream is centered in the beam while the stream oscillates. As described above, the maximum amount of energy is refracted away from the detector while the stream is centered in the light beam. With a centered stream embodiment, the frequency measured with the sensor will be twice the frequency of oscillation of the stream, because the stream will pass the center of the beam twice for each oscillation of the stream. Therefore, other frequencies can be measured from the sensors in addition to the frequency of the stream.

Figure 9:
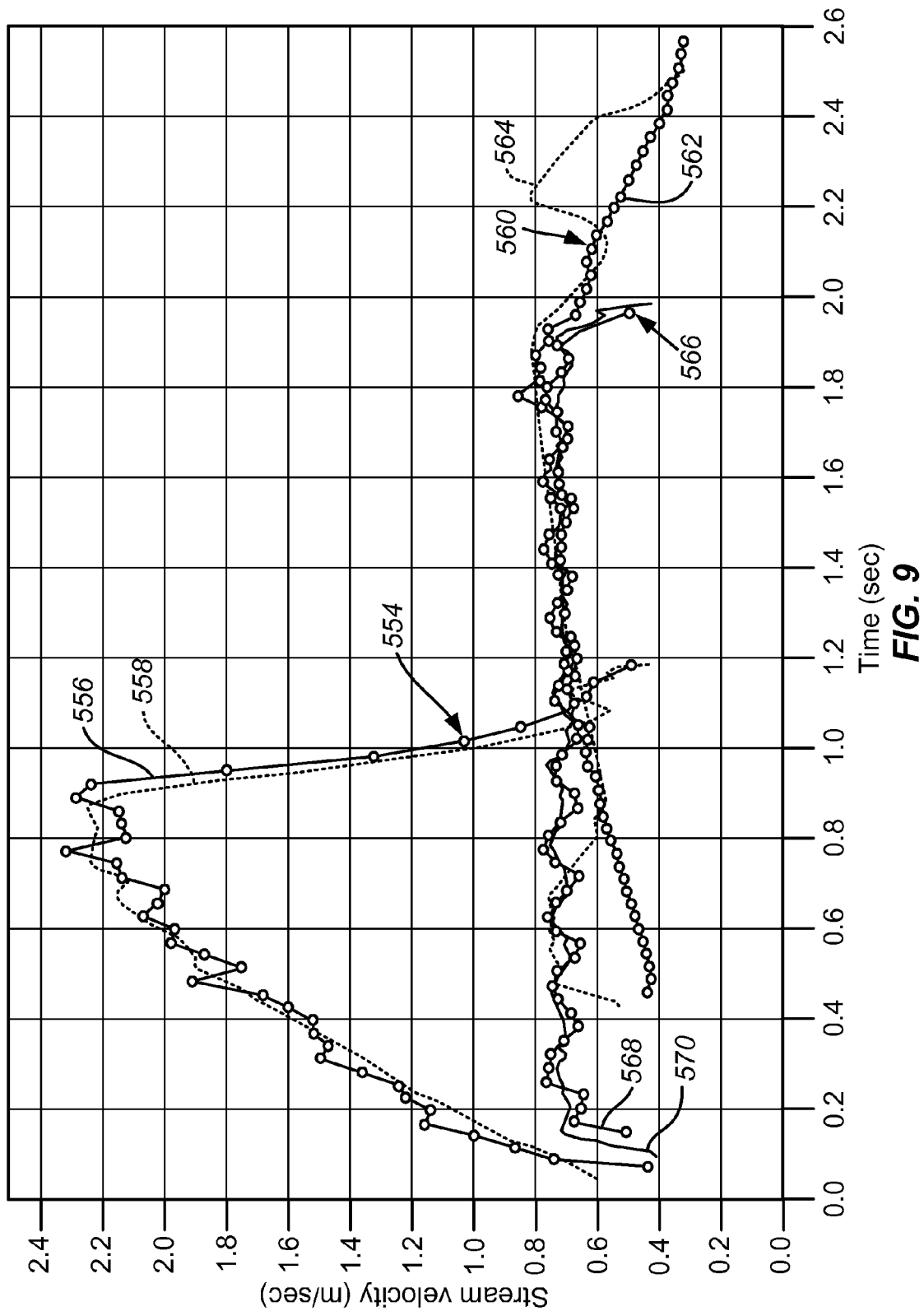
FIG. 9 illustrates a graph showing velocity of a liquid stream over time as measured with sensors and verified with a camera for three liquid delivery plans according to an embodiment of the present invention.

FIG. 9 illustrates a graph showing velocity over time of a liquid stream as measured with sensors and verified with a camera for three liquid delivery plans according to an embodiment of the present invention. A velocity of the falling free stream of liquid is shown in meters per second versus time in seconds. A 2 milliliter (ml) in 1 second (s) delivery plan 554 is shown to have a sensor velocity profile 456 and a camera velocity profile 558. The sensor velocity profile is calculated with a phase shift from the sensor signals as described above. The camera velocity profile is determined by analysis of features of movie frame images, for example an edge of the stream. A 2 ml in 2 seconds delivery plan 560 is shown to have a sensor velocity profile 562 and a digital movie camera velocity profile 564. A 1 ml in 2 seconds delivery plan 566 is shown to have a sensor velocity profile 568 and a movie camera velocity profile 570. Over most of the time periods shown, the sensor velocity profiles agree with the movie velocity profiles. Such measurements can be used to calibrate and verify velocity measurements with the sensors.

Figure 10A:
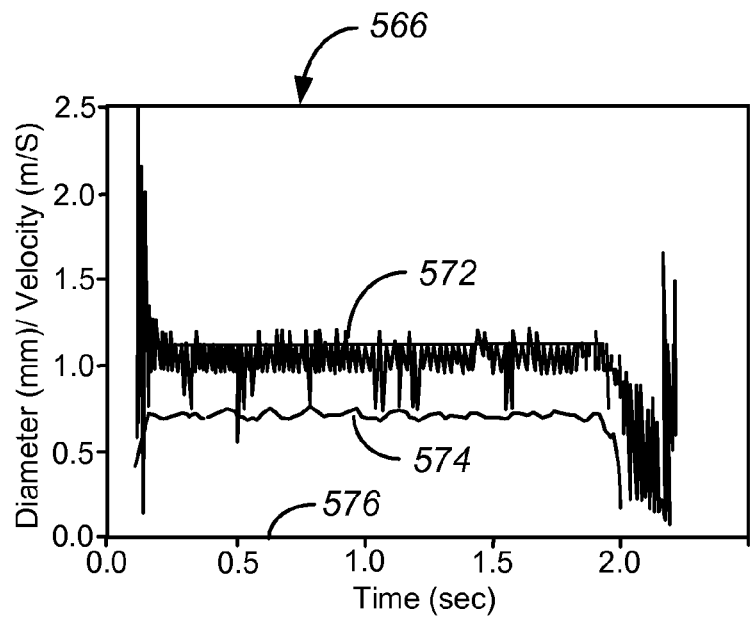
FIGS. 10A to 10C illustrate graphs showing diameter versus time and velocity versus time of a liquid stream as measured with sensors for three delivery plans according to an embodiment of the present invention.
Figure 10B:
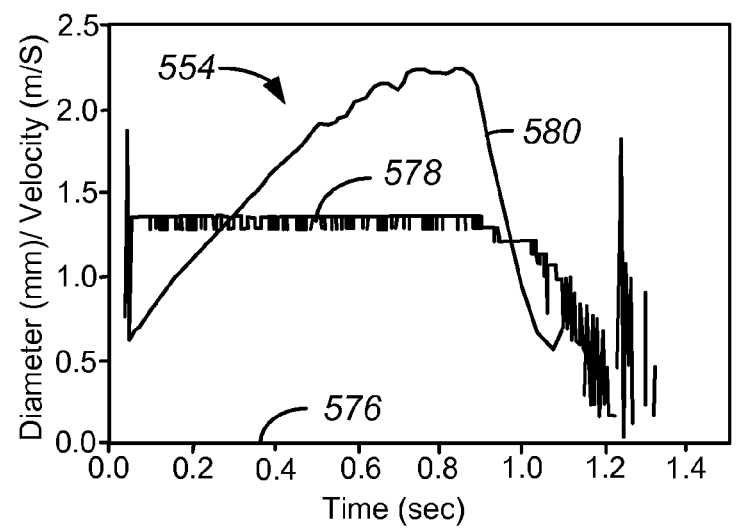
Figure 10C:
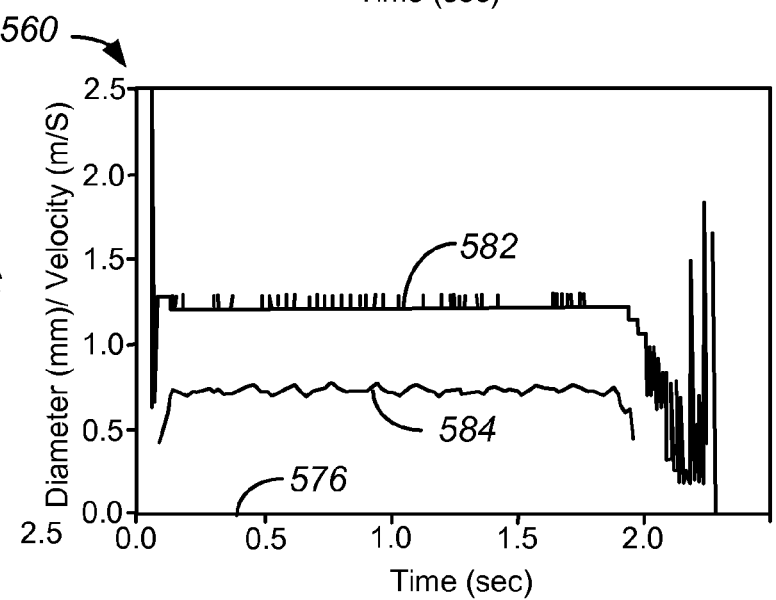

FIGS. 10A to 10C illustrate graphs showing diameter versus time and velocity versus time of a liquid stream as measured with sensors for three delivery plans according to an embodiment of the present invention. FIG. 10A shows a diameter 572 (mm) of the stream versus time (s) and a velocity 474 over time for 1 ml in 2 seconds delivery plan 566. In an embodiment, two runs are performed with a first run for velocity and a second run for diameter; this embodiment assumes the streams are repeatable. The diameter and velocity are determined as described above. FIG. 10B shows a diameter 478 (mm) versus time (s) and a velocity 580 versus time of the stream for 2 ml in 1 s delivery plan 554. FIG. 10C shows a diameter 582 (mm) versus time 476 (s) and a velocity 584 versus time 476 of the stream for 2 ml in 2 seconds delivery plan 560. The diameter and velocity are integrated over time to determine the total volume of fluid delivered. In this respect, the area under each of the profiles shown in FIGS. 10A to 10C is related and/or correlated to the total volume of fluid delivered with each of the delivery plans.

The sensors can be used to show the physics of free stream flow with reference FIGS. 10A to 10C. For example in FIG. 10B, the diameter of the stream is nearly constant at about 1.4 mm for velocities from about 1 to 2 meters per second. This illustrates that the diameter of the stream remains constant at approximately the inside diameter of the nozzle once the velocity of the free stream exiting the nozzle is sufficiently great. For lower free stream velocities as shown in FIGS. 10A and 10C, the diameter of the free stream decreases with decreasing stream velocity.

FIG. 11 illustrates a comparison of delivery volumes as determined by weight to delivery volumes as determined by integration of stream cross sectional diameter and velocity over time, according to an embodiment of the present invention. A table 586 shows data which can be measured. A measurement run column 588 indicates a measurement run with the above illustrated apparatus. A setpoint column 590 shows a desired delivery plan. A measured weight column 592 shows a measured weight and corresponding volume. An inferred volume by integration column 594 shows the volume determined by integration with the apparatus illustrated above. For Run 1, the volume determined by integration for 1 ml in 2 s delivery plan 566 is 1.14 ml and the volume determined by weight is 1.01 ml. For Run 2, the volume determined by integration for 2 ml in 2 s delivery plan 560 is 1.29 ml and the measured volume determined by weight is 2.12 ml. For Run 3, the volume determined by integration for 2 ml in 2 s delivery plan 554 is 2.05 ml and the measured volume determined by weight is 2.03 ml. Although the measured volume by weight can differ from the measured volume determined by integration, this difference can be corrected by using measured weight data to calibrate the delivered volume as measured by integration with the sensors for each delivery plan. This calibration based on delivery plan measurements can be especially beneficial where the measured volume is highly repeatable and precise for a period of time, for example one day, so that the volume determined with the sensors will be accurate for each delivery plan calibrated.

In addition to determination of total fluid volume delivered, measurement of the free flowing stream extending beyond the nozzle has other advantages. For example, the delivered profiles of sensor measurements over time can be compared throughout the use of the system to detect failure of components or potential failure before a component fails. Also, bubble can be detected and other irregularities in the stream.

While the calculation of the average velocity has been shown above with reference to a fairly simple model of free stream fluid flow, the actual velocity and/or diameter of the stream can be calculated by providing additional information and mathematical modeling of the physical properties of the liquid stream and measurement apparatus. For example, the velocity of the free stream as the liquid stream falls from the upper location to the lower location can be calculated by taking into consideration the height which the stream falls and conversion of potential energy to kinetic energy as the stream falls. The conversion of potential energy to kinetic energy can be taken into consideration with the acceleration due to gravity (g), and time ($\Delta t$) in which the stream has fallen from the upper location. For example, a simple formula $$V_1 = V_{ave} - (1/2)*g*(\Delta t)$$

Can be used to calculate the initial stream velocity ($V_1$) at the upper location from the average velocity ($V_{ave}$). As the acceleration due to gravity is constant, the final velocity at the downstream location can be calculate from $$V_2 = V_1 + g*(\Delta t)$$

where $V_2$ is the free stream velocity at the downstream location.

Other physical characteristics of the stream can be taken into consideration including the viscosity of the liquid and surface tension effects.

Figure 12:
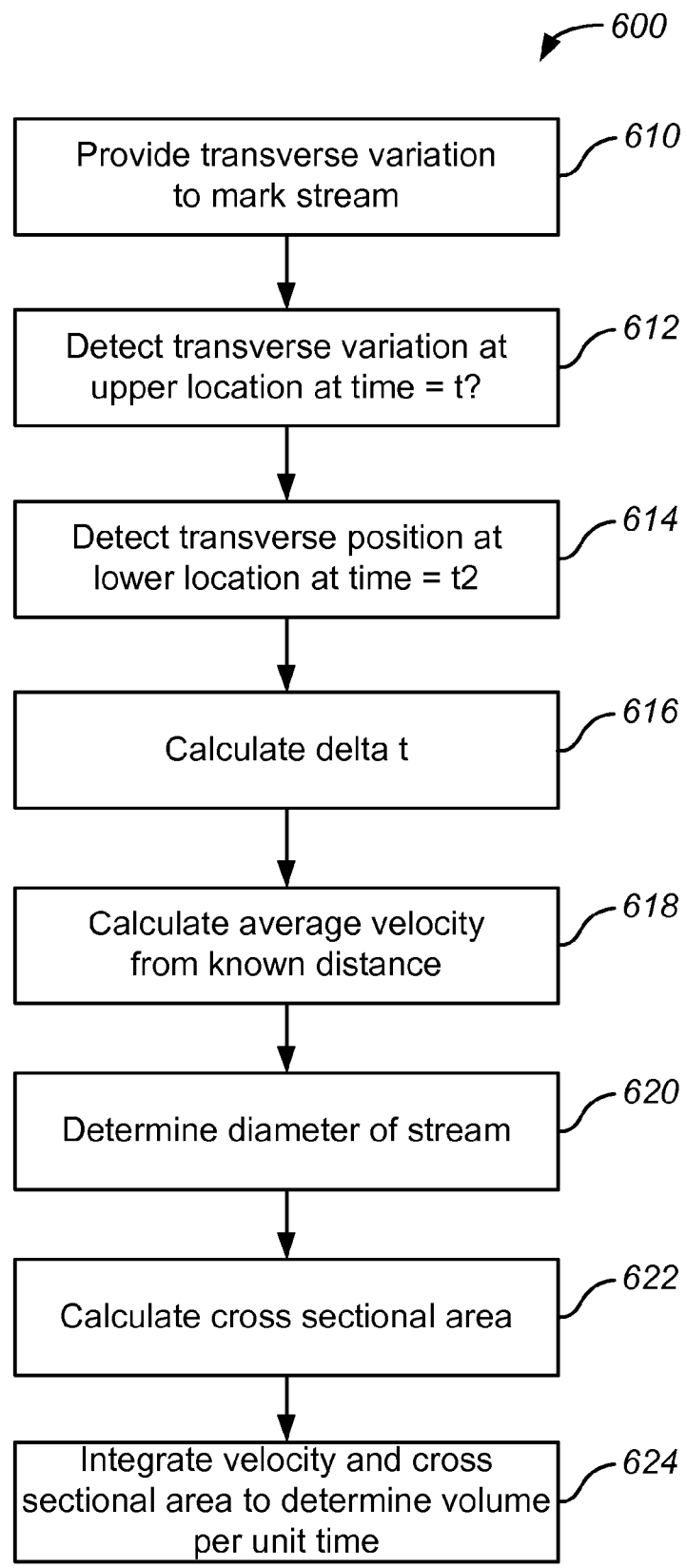
FIG. 12 is a simplified flowchart illustrating a method of measuring flow characteristics of a fluid stream according to an embodiment of the present invention.

FIG. 12 is a simplified flowchart illustrating a method 600 of measuring flow characteristics of a fluid stream according to an embodiment of the present invention. A provide transverse variation in stream flow step 610 is provided to mark the stream. This transverse variation step can be provided by a moving arm, puff of gas, or rotating eccentric weight as described above. The transverse variation of the stream can be momentary as with a short puff or gas, or can be continuous with a sine wave as described above. A detect transverse variation at upper location at time=t1 step 612 detects the time at which the marked stream passes the upper location. A detect transverse variation at time=t2 step 614 detects the time at which the marked stream passes the lower location. A calculate delta t step 616 determines the time the marked stream took to travel from the upper location to the lower location. Delta t can be calculated from a phase relationship between upper and lower signals as described above. A calculate average velocity from known distance step 618 calculates the average velocity by dividing the distance between the upper and lower locations by delta t. The velocity at the upper location and velocity at the lower location can also be calculated as described above. A determine diameter of stream step 620 determines the diameter of the stream, for example an average diameter of the stream. A calculate cross sectional area step 622 calculates the average cross sectional area of the stream from the average diameter as described above. An integrate velocity and cross sectional area to determine volume per unit time step integrates the product of the average velocity of the stream and the average cross sectional area of the stream over an appropriate time interval to determine the average volume per unit time of the stream flow.

In some embodiments, it is desirable to use velocities and diameters corresponding to the location where the stream is measured. For example, it may be desirable to measure a diameter of the stream at the lower location and determine the velocity of the stream at the lower location as described above. In such embodiments, the volume per unit time of the stream flow at the lower location can be calculated by integrating the product of the cross sectional area at the lower location and the velocity at the lower location.

It should be appreciated that the specific steps illustrated in FIG. 12 provide a particular method of measuring flow characteristics of a free stream according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method of measuring a flow of a liquid stream for a semiconductor process, the method comprising:
   delivering the stream through a liquid delivery nozzle, the nozzle adapted to deliver liquid for the semiconductor process, the stream extending from an upstream location to a downstream location beyond the nozzle;
   marking the stream at the upstream location;
   measuring the stream at the downstream location to determine the flow, and
   projecting a light beam toward the stream to determine the flow of the stream with light traveling past the stream at the downstream location.

2. The method of claim 1 wherein the stream exits the nozzle and the stream comprises a free stream extending from the nozzle to the downstream location.

3. The method of claim 1 wherein the flow of the stream comprises at least one of a flow velocity, a flow volume per unit time, or a total flow volume delivered with the stream.

4. The method of claim 1 wherein a size of the stream is measured over time to determine at least one of the size of the stream over time, regularity of the size of the stream over time, gas bubbles in the stream or drops in the stream, and wherein the semiconductor process liquid is applied to the substrate in response to the size of the stream over time.

5. The method of claim 1 wherein measuring the stream comprises determining at least one of a position or a phase of the stream at the downstream location.

6. The method of claim 5 wherein the phase of the stream correlates with a velocity of the stream.

7. The method of claim 1 wherein marking the stream comprises moving the stream transverse to the flow.

8. The method of claim 7 wherein marking the stream comprises moving the stream from a first position to a second position transverse to the flow.

9. The method of claim 1 wherein measuring comprises determining a size of the stream at the downstream location, and wherein at least one of a velocity or a phase of the stream are combined with the size to determine the flow volume and/or flow volume per unit time of the stream.

10. The method of claim 9 wherein the size of the stream comprises at least one of a diameter, a width, a circumference or a cross-sectional area of the stream at the downstream location.

11. The method of claim 1 further comprising:
    measuring the stream at the upstream location; and
    comparing the stream at the upstream location to the stream at the downstream location to determine at least one of a phase or a velocity of the stream.

12. The method of claim 11 further comprising projecting an upstream light beam toward the stream at the upstream location to determine the flow.

13. The method of claim 1 further comprising determining a diameter of the stream;
    calculating a cross sectional area of the stream from the diameter; and
    integrating the cross sectional area and a velocity to determine a volume per unit time.

14. The method of claim 13 wherein the velocity comprises an average velocity and the cross sectional area comprises an average cross sectional area.

* * * * *